(12) United States Patent
Moon et al.

(10) Patent No.: US 12,272,680 B2
(45) Date of Patent: *Apr. 8, 2025

(54) LIGHT-EMITTING DEVICE PACKAGE AND ELECTRONIC DEVICE

(71) Applicant: LG Display Co., Ltd., Seoul (KR)

(72) Inventors: JeYoung Moon, Geumsan-gun (KR); SangHo Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 7 days.

This patent is subject to a terminal disclaimer.

(21) Appl. No.: 17/688,486

(22) Filed: Mar. 7, 2022

(65) Prior Publication Data
US 2022/0199591 A1    Jun. 23, 2022

Related U.S. Application Data

(63) Continuation of application No. 16/045,078, filed on Jul. 25, 2018, now Pat. No. 11,296,056.

(30) Foreign Application Priority Data

Oct. 31, 2017    (KR) ........................ 10-2017-0143437

(51) Int. Cl.
*H01L 25/075*    (2006.01)
*H01L 33/62*    (2010.01)
*H05B 45/20*    (2020.01)

(52) U.S. Cl.
CPC ........ *H01L 25/0753* (2013.01); *H01L 25/075* (2013.01); *H01L 33/62* (2013.01); *H05B 45/20* (2020.01)

(58) Field of Classification Search
CPC combination set(s) only.
See application file for complete search history.

(56) References Cited

U.S. PATENT DOCUMENTS

| | | | |
|---|---|---|---|
| 8,324,654 B2 | 12/2012 | An et al. | |
| 9,048,367 B2 | 6/2015 | Huang et al. | |
| 10,018,776 B2 * | 7/2018 | Itoh | G02B 6/0026 |
| 10,062,673 B2 * | 8/2018 | Schmidt | C09K 11/886 |
| 11,296,056 B2 * | 4/2022 | Moon | H01L 33/62 |

(Continued)

FOREIGN PATENT DOCUMENTS

| | | |
|---|---|---|
| CN | 101688644 A | 3/2010 |
| CN | 102714260 A | 10/2012 |

(Continued)

*Primary Examiner* — Mark W Tornow
*Assistant Examiner* — Priya M Rampersaud
(74) *Attorney, Agent, or Firm* — Seed IP Law Group LLP

(57) ABSTRACT

Embodiments of the present disclosure relate to a light-emitting device package and an electronic device. In an embodiment, a light-emitting device package is provided that includes a lead frame, at least two light-emitting devices mounted on the lead frame and configured to emit different wavelengths of a same color of light, and a phosphor configured to emit light having a color different from the color of light emitted from the at least two light-emitting devices. The embodiments of the present disclosure also relate to an electronic device including the light-emitting device package as a light source. According to the embodiments of the present disclosure, various expressible color spaces can be selectively expressed.

18 Claims, 31 Drawing Sheets

(56) References Cited

U.S. PATENT DOCUMENTS

| | | |
|---|---|---|
| 2004/0217364 A1 | 11/2004 | Tarsa et al. |
| 2005/0127816 A1* | 6/2005 | Sumitani ............. H01L 25/0753 |
| | | 257/E33.072 |
| 2006/0043879 A1* | 3/2006 | Naitou .................... H01L 33/60 |
| | | 313/501 |
| 2006/0197098 A1* | 9/2006 | Aihara ................ H01L 25/0753 |
| | | 257/89 |
| 2007/0223219 A1* | 9/2007 | Medendorp ........ C09K 11/7702 |
| | | 257/E33.001 |
| 2010/0134043 A1* | 6/2010 | Kadotani ................ H05B 45/40 |
| | | 257/89 |
| 2010/0140634 A1 | 6/2010 | van de Ven et al. |
| 2010/0157583 A1 | 6/2010 | Nakajima |
| 2011/0215349 A1* | 9/2011 | An ........................ H01L 33/486 |
| | | 257/89 |
| 2011/0228514 A1 | 9/2011 | Tong et al. |
| 2013/0020929 A1 | 1/2013 | van de Ven et al. |
| 2013/0114242 A1 | 5/2013 | Pickard et al. |
| 2013/0242543 A1 | 9/2013 | Do et al. |
| 2014/0034901 A1* | 2/2014 | Moon ..................... H01L 33/04 |
| | | 257/13 |
| 2015/0084542 A1 | 3/2015 | Chen |
| 2015/0097200 A1* | 4/2015 | Bergmann .............. H01L 33/50 |
| | | 257/89 |
| 2015/0372211 A1* | 12/2015 | Cai ..................... H01L 25/0753 |
| | | 257/99 |
| 2016/0033715 A1* | 2/2016 | Lee ...................... G02B 6/0073 |
| | | 257/89 |
| 2017/0018538 A1* | 1/2017 | Tiwari .................... H01L 25/50 |
| 2017/0162547 A1 | 6/2017 | Bergmann et al. |
| 2017/0309789 A1* | 10/2017 | Kurimoto ............. H01L 27/156 |
| 2019/0073944 A1 | 3/2019 | Li |

FOREIGN PATENT DOCUMENTS

| | | |
|---|---|---|
| CN | 103650185 A | 3/2014 |
| CN | 106664765 A | 5/2017 |
| KR | 10-2009-0132920 A | 12/2009 |
| KR | 10-2010-0066768 A | 6/2010 |
| KR | 10-2017-0032020 A | 3/2017 |

* cited by examiner

Front View

Left View

Right View

IN-PKG1 & IN-PKG2 Driving

Front View

Left View

Right View

[ Mode 1 : Full Operation ]

[ Mode 2 : Adobe Operation ]

LIGHT-EMITTING DEVICE PACKAGE AND ELECTRONIC DEVICE

CROSS REFERENCE TO RELATED APPLICATION

This application is a continuation of U.S. patent application Ser. No. 16/045,078, filed Jul. 25, 2018, which claims priority from Korean Patent Application No. 10-2017-0143437, filed on Oct. 31, 2017, which is hereby incorporated by reference for all purposes as if fully set forth herein.

BACKGROUND

Technical Field

The present disclosure relates to a light-emitting device package and an electronic device.

Description of the Related Art

Currently, a display device utilizes, as a light source, a light-emitting device package including a light-emitting device such as a Light-Emitting Diode (LED) and at least one type of phosphor.

The phosphor used in such a conventional light-emitting device package has a light emission spectrum characteristic, which is wider than a wavelength band corresponding to a color to be expressed by the phosphor itself. As a result, there is a limitation in defining a color space to be expressed.

In addition, since the conventional light-emitting device package emits light with a single visible light wavelength spectrum according to an electrical current introduced thereinto, the light-emitting device package is only able to express one color space.

Meanwhile, demand for various color spaces is increasing. However, in order to implement various color spaces in an electronic device such as a display device, different light-emitting device packages suited to color spaces to be expressed are separately required.

BRIEF SUMMARY

In view of the foregoing, an aspect of embodiments of the present disclosure is to provide a light-emitting device package and an electronic device capable of expressing various color spaces.

Another aspect of embodiments of the present disclosure is to provide a light-emitting device package and an electronic device capable of selecting one of various expressible color spaces and expressing the selected color space.

Still another aspect of embodiments of the present disclosure is to provide a light-emitting device package and an electronic device capable of adaptively controlling an expressible color space in accordance with a user's demand or a display situation.

In one or more embodiments of the present disclosure, a light-emitting device package is provided including a lead frame, at least two light-emitting devices mounted on the lead frame and configured to emit different wavelengths of a same color of light, and a phosphor configured to emit light having a color different from the color of light emitted from the at least two light-emitting devices.

In such a light-emitting device package, the two or more light-emitting devices emit lights having the same color and different wavelengths.

In one or more embodiments, the present disclosure provides a light-emitting device package including a lead frame, a first light-emitting device mounted on the lead frame, a second light-emitting device mounted on the lead frame, a third light-emitting device mounted on the lead frame, a fourth light-emitting device mounted on the lead frame, and a phosphor contained in an encapsulant present on the first, second, third, and fourth light-emitting devices.

In such a light-emitting device package, the phosphor may emit a first color light, the first light-emitting device and the second light-emitting device may emit second color lights, and the third light-emitting device and the fourth light-emitting device may emit third color lights.

The first light-emitting device may emit second color lights having different wavelengths.

The lead frame may include a first lead frame on which the first light-emitting device is mounted, a second lead frame on which the second light-emitting device is mounted, a third lead frame on which the third light-emitting device is mounted, a fourth lead frame on which the fourth light-emitting device is mounted.

An insulator may be disposed between the first, second, third, and fourth lead frames.

The wavelength of the second color light emitted from the first light-emitting device may be shorter than the wavelength of the second color light emitted from the second light-emitting device.

In such a light-emitting device package, the first light-emitting device and the third light-emitting device may constitute a first internal light-emitting device package, and the second light-emitting device and the fourth light-emitting device may constitute a second internal light-emitting device package.

The light-emitting device package may further include a partition wall located between the first and second internal light-emitting device packages.

When a partition wall structure exists, the phosphor may include a first phosphor existing in a region of the first internal light-emitting device package and a second phosphor existing in a region of the second internal light-emitting device package.

The first phosphor and the second phosphor may emit first color lights having different wavelengths.

The wavelength of the second color light emitted from the second light-emitting device may be longer than the wavelength of the second color light emitted from the first light-emitting device.

The wavelength of the first color light emitted from the second phosphor may be longer than the wavelength of the first color light emitted from the first phosphor.

The wavelength bandwidth of the first color light emitted from the second phosphor may be narrower than the wavelength bandwidth of the first color light emitted from the first phosphor.

The third light-emitting device and the fourth light-emitting device may emit third color lights having the same wavelength.

The third light-emitting device and the fourth light-emitting device may emit third color lights having different wavelengths.

In one or more embodiments, the present disclosure provides an electronic device including a light-emitting device package configured to output white light, and a driver configured to drive the light-emitting device package.

The light-emitting device package may include a lead frame, a first light-emitting device mounted on the lead frame, a second light-emitting device mounted on the lead frame, a third light-emitting device mounted on the lead frame, a fourth light-emitting device mounted on the lead frame, and a phosphor contained in an encapsulant present on the first, second, third, and fourth light-emitting devices.

The controller may control whether to drive each of the first light-emitting device and the second light-emitting device according to user setting information or content information.

According to the embodiments of the present disclosure described herein, it is possible to provide a light-emitting device package and an electronic device capable of expressing various color spaces.

According to the embodiments of the present disclosure, it is possible to provide a light-emitting device package and an electronic device capable of selecting one of various expressible color spaces and expressing the selected color space.

According to the embodiments of the present disclosure, it is possible to provide a light-emitting device package and an electronic device capable of adaptively controlling an expressible color space in accordance with a user's demand or a display situation.

BRIEF DESCRIPTION OF THE SEVERAL VIEWS OF THE DRAWINGS

The above and other aspects, features and advantages of the present disclosure will be more apparent from the following detailed description taken in conjunction with the accompanying drawings, in which.

DETAILED DESCRIPTION

Figure 1:
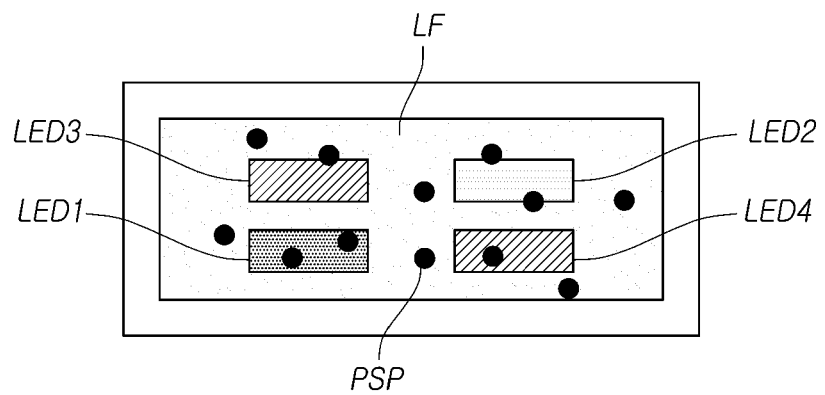
FIG. 1 is a diagram illustrating a light-emitting device package according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

First, a basic structure of a light-emitting device package according to the present disclosure will be briefly described, and then a light-emitting device package according to embodiments of the present disclosure will be described with reference to the drawings.

A light-emitting device package according to the present disclosure may include a lead frame LF, two or more light-emitting devices (e.g., LED 1 and LED2 in FIG. 1) mounted on the lead frame LF and configured to emit color lights having the same color (e.g., color lights having any one of red, green, and blue color), and at least one type of phosphor for emitting a color light having a color different from that of the color lights emitted from the two or more light-emitting devices (e.g., LED1 and LED2 in FIG. 1).

In the light-emitting device package according to the present disclosure, even if the two or more light-emitting devices (e.g., LED1 and LED2 in FIG. 1) emit color lights having the same color, the two or more light-emitting devices may emit color lights having different wavelengths (e.g., a green light having a relatively short wavelength and a green light having a long wavelength).

In an example, the light-emitting device package according to the present disclosure may include two green light-emitting devices configured to emit green light of different wavelengths, red phosphor for emitting red light, and blue phosphor for emitting blue light, thereby emitting white light. That is, the light-emitting device package emits white light, e.g., by a combination of the emitted green light, red light, and blue light.

In another example, the light-emitting device package according to the present disclosure may include two green light-emitting devices configured to emit green light of different wavelengths, two blue light-emitting devices configured to emit blue light of the same wavelength, and red phosphor for emitting red light, thereby emitting white light.

In still another example, the light-emitting device package according to the present disclosure may include two green light-emitting devices configured to emit green light of different wavelengths, two blue light-emitting devices configured to emit blue light of the same wavelength, and two types of red phosphor for emitting red light of different wavelengths, thereby emitting white light.

In still another example, the light-emitting device package according to the present disclosure may include two green light-emitting devices configured to emit green light of different wavelengths, two blue light-emitting devices configured to emit blue light of different wavelengths, and red phosphor for emitting red light, thereby emitting white light.

In still another example, the light-emitting device package according to the present disclosure may include two green light-emitting devices configured to emit green light of different wavelengths, two blue light-emitting devices configured to emit blue light of different wavelengths, and two types of red phosphor for emitting red light of different wavelengths, thereby emitting white light.

By using the light-emitting device package according to the present disclosure, the characteristics of a white light source can be remarkably improved. Accordingly, it is possible to express various color spaces using a single light-emitting device package.

Hereinafter, a light-emitting device package according to the present disclosure briefly described above will be described by way of an example with reference to the drawings.

FIG. 1 is a diagram illustrating a light-emitting device package LED-PKG according to embodiments of the present disclosure.

Referring to FIG. 1, a light-emitting device package LED-PKG according to embodiments of the present disclosure may include a lead frame LF, a first light-emitting device LED1 mounted on the lead frame LF, a second light-emitting device LED2 mounted on the lead frame LF, a third light-emitting device LED3 mounted on the lead frame LF, a fourth light-emitting device LED4 mounted on the lead frame LF, and phosphor PSP contained in an encapsulant (ENCAP in FIG. 6) existing on the first, second, third, and fourth light-emitting devices LED1, LED2, LED3, and LED4.

The phosphor PSP may emit a first color light.

The first light-emitting device LED1 and the second light-emitting device LED2 may emit second color lights.

The third light-emitting device LED3 and the fourth light-emitting device LED4 may emit third color lights.

The phosphor PSP may emit the first color light by absorbing energy from the second color lights emitted from the first light-emitting device LED1 and the second light-emitting device LED2 and the third color lights emitted from the third light-emitting device LED3 and the fourth light-emitting device LED4.

The first color light, the second color light, and the third color light may be the lights having different colors. For example, the first color light, the second color light, and the third color light may be lights corresponding the three primary colors, respectively.

Meanwhile, in the light-emitting device package LED-PKG according to the embodiments of the present disclosure, the first light-emitting device LED1 and the second light-emitting device LED2 may emit the second color lights having different wavelengths within the wavelength band of the second color.

When the different light emission characteristics of the first light-emitting device LED1 and the second light-emitting device LED2 in the light-emitting device package LED-PKG according to the embodiments of the present disclosure are used, it is possible to dramatically improve the characteristics of a white light source. Accordingly, it is possible to express various color spaces using one light-emitting device package LED-PKG.

Figure 2:
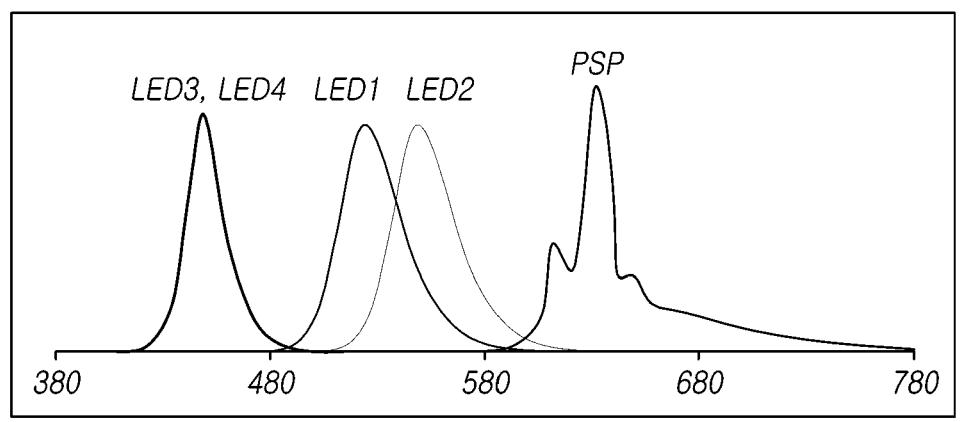
FIG. 2 is a diagram illustrating a light emission spectrum of the light-emitting device package according to embodiments of the present disclosure.

FIG. 2 is a diagram illustrating a light emission spectrum of a light-emitting device package LED-PKG according to the embodiments of the present disclosure.

As described above, the phosphor PSP may emit the first color light, the first light-emitting device LED1 and the second light-emitting device LED2 may emit the second color lights, and the third light-emitting device LED3 and the fourth light-emitting device LED4 may emit the third color lights.

The first color light, the second color light, and the third color light may be lights having different colors.

The respective wavelength bands of the first color light, the second color light, and the third color light may belong to the visible light wavelength band and may be completely different from each other (e.g., mutually exclusive bands) or partially overlap each other.

For example, the first color light has a wavelength band corresponding to highest wavelengths among the first, second, and third color lights (e.g., a red wavelength band), the second color light has a wavelength band corresponding to the next highest wavelengths (e.g., a green wavelength band), and the third color light has a wavelength band corresponding to the lowest or shortest wavelengths (e.g., a blue wavelength band). That is, the second color light may have a wavelength band between the wavelength bands of the first color light and the third color light.

More specifically, as illustrated in FIG. 2, the first color light emitted from the phosphor PSP may be red light, and may have a wavelength belonging to, for example, a red wavelength band of about 600 to 750 nm in a visible light wavelength band (about 380 to 750 nm). The second color lights emitted from the first light-emitting device LED1 and the second light-emitting device LED2 may be green light, and may have a wavelength belonging to, for example, a green wavelength bandwidth of about 500 to 600 nm in the visible light wavelength band (about 380 to 750 nm). The third color lights emitted from the third light-emitting device LED3 and the fourth light-emitting device LED4 may be blue lights, and may have a wavelength belonging to, for example, a blue wavelength bandwidth of about 380 to 500 nm in the visible light wavelength band (about 380 to 750 nm). Thus, as described herein, the wavelength bands of the red, green, and blue color lights may account for the entire visible light wavelength spectrum, i.e., wavelengths from about 380 to 750 nm. While the visible spectrum may include other colors, such as orange, yellow, cyan, violet, it will be readily appreciated that each of these colors has a spectrum that falls within one or more of the red, green, and blue wavelengths bands as described herein. For example, yellow light may sometimes be considered as visible light having a wavelength band of about 570 to 590 nm; however, as described herein, yellow light within this wavelength band is considered to be a part of the green wavelength band, which ranges from about 500 to 600 nm.

According to the above description, it is possible to express various color regions using green lights having different wavelengths.

Hereinafter, for the convenience of explanation, it is assumed that the first color light is a red light, the second color light is a green light, and the third color light is a blue light.

Meanwhile, referring to FIG. 2, in the light-emitting device package LED-PKG according to the embodiments of the present disclosure, the wavelength of the second color light (e.g., green light) emitted from the first light-emitting device LED1 and the wavelength of the second color light (e.g., green light) emitted from the second light-emitting device LED2 may be different from each other within the wavelength band range of the second color light (e.g., a green wavelength band range).

For example, as illustrated in FIG. 2, the wavelength of the second color light emitted from the first light-emitting device LED1 may be shorter than the wavelength of the second color light emitted from the second light-emitting device LED2. The wavelengths bands of the second color light (e.g., green light) that are emitted from the first and second light-emitting devices LED1, LED2 may partially overlap, as shown in FIG. 2.

As described above, by using the first and second light-emitting devices LED1 and LED2 that emit green lights corresponding to the intermediate wavelength band between the red wavelength band and the blue wavelength band with different wavelengths, it is possible to effectively express various color regions.

Referring to FIG. 2, in the light-emitting device package LED-PKG according to the embodiments of the present disclosure, the third light-emitting device LED3 and the fourth light-emitting device LED4 may emit the third color lights having the same wavelength (e.g., blue light). That is, as shown in FIG. 2, the band of wavelengths emitted from each of the third and fourth light-emitting devices LED3, LED4 may completely overlap, with both of the third and fourth light-emitting devices LED3, LED4 emitting blue light of a same wavelength band.

According to this, by controlling only the driving of each of the first and second light-emitting devices LED1 and LED2 that emit green lights having different wavelengths, it is possible to express various color regions at low cost.

Figure 3:
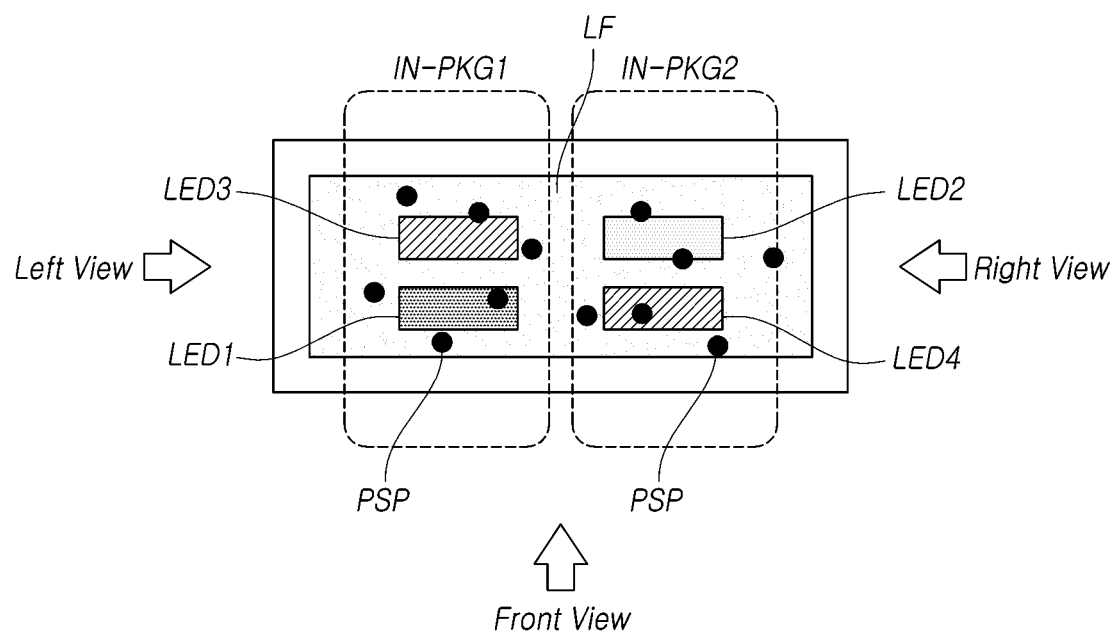
FIG. 3 is a diagram illustrating a top view of two types of internal light-emitting device packages of the light-emitting device package according to embodiments of the present disclosure.
Figure 4:
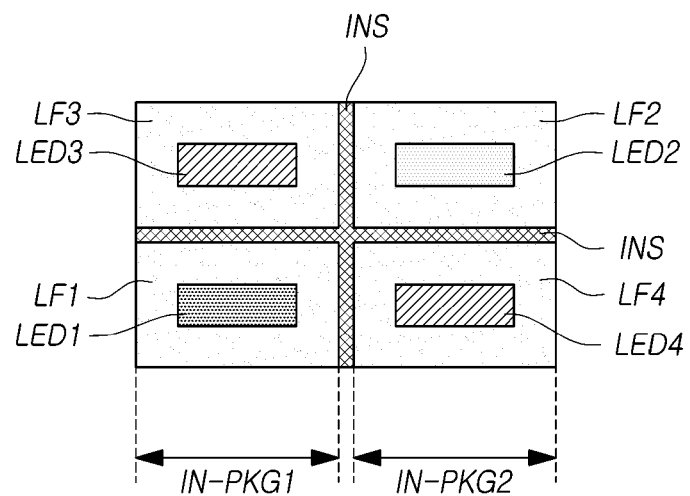
FIG. 4 is a diagram illustrating a structure of a lead frame of the light-emitting device package according to embodiments of the present disclosure.
Figure 5:
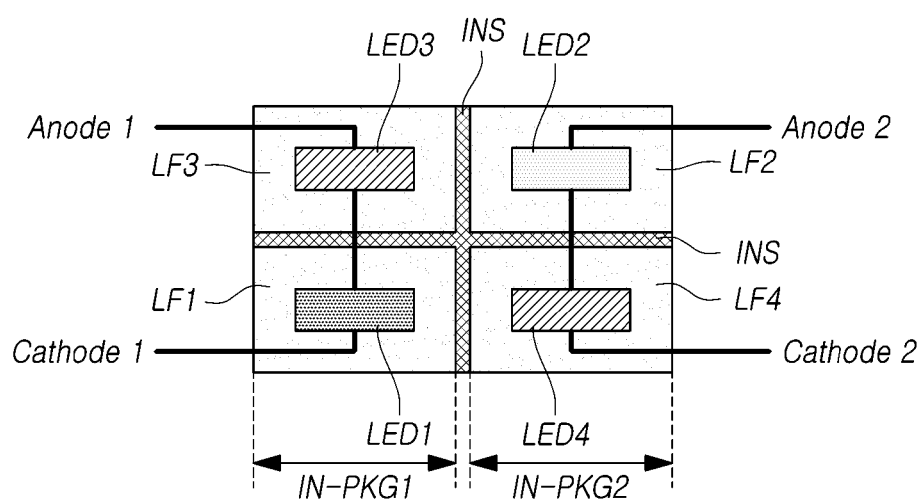
FIG. 5 is a diagram illustrating a voltage application structure of the light-emitting device package according to embodiments of the present disclosure.
Figure 6:
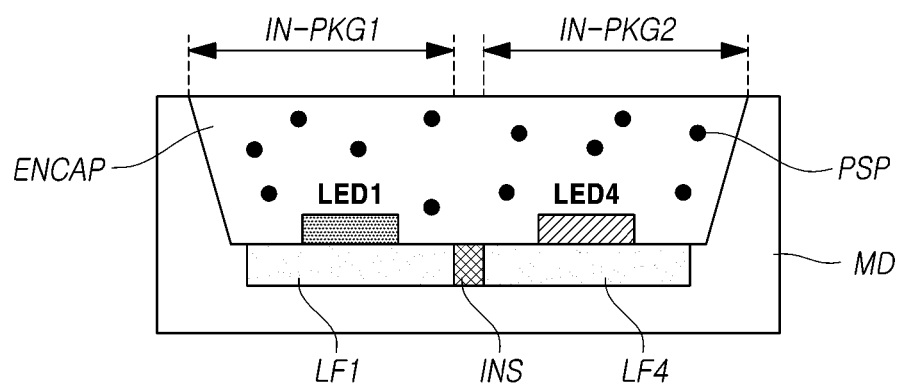
FIGS. 6, 7, and 8 are diagrams illustrating a front view, a left side view, and a right side view, respectively, of the light-emitting device package shown in FIG. 3 according to embodiments of the present disclosure.
Figure 7:
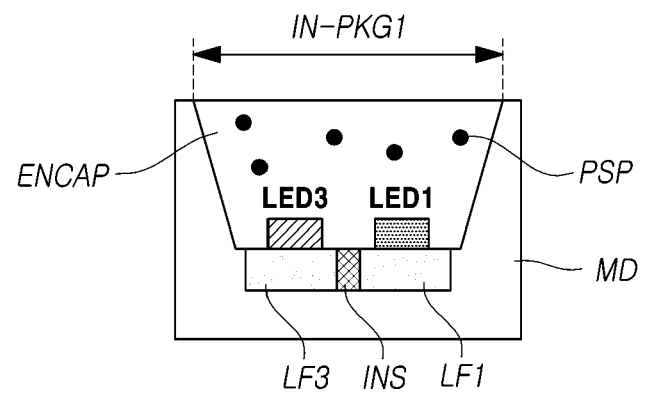
Figure 8:
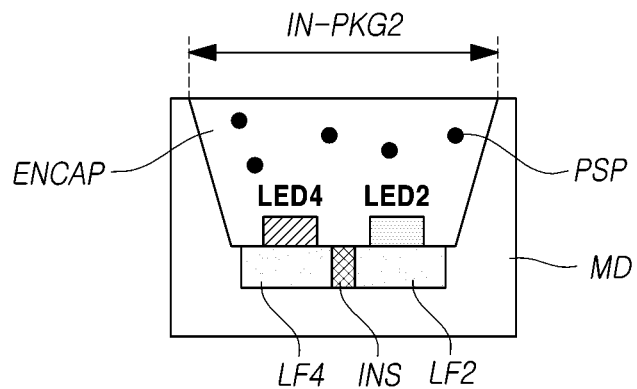

FIG. 3 is a diagram illustrating two types of internal light-emitting device packages IN-PKG1 and IN-PKG2 of the light-emitting device package LED-PKG according to the embodiments of the present disclosure, FIG. 4 is a diagram illustrating a structure of a lead frame LF of the light-emitting device package LED-PKG according to the embodiments of the present disclosure, FIG. 5 is a diagram illustrating a voltage application structure of the light-emitting device package LED-PKG according to the embodiments of the present disclosure, and FIGS. 6, 7, and 8 are diagrams illustrating a front view, a left side view, and a right side view, respectively, of the light-emitting device package LED-PKG shown in FIG. 3 according to the embodiments of the present disclosure.

As described above, in the light-emitting device package LED-PKG according to the embodiments of the present disclosure, the first light-emitting device LED1 and the second light-emitting device LED2 may emit the second color lights having different wavelengths.

Accordingly, it can be said that the light-emitting device package LED-PKG according to the embodiments of the present disclosure includes a first internal light-emitting device package IN-PKG1 including the first light-emitting device LED1, and a second internal light-emitting device package IN-PKG2 including the second light-emitting device LED2.

Referring to FIG. 3 and FIGS. 6 to 8, in the light-emitting device package LED-PKG according to embodiments of the present disclosure, the first internal light-emitting device package IN-PKG1 may include a first light-emitting device LED 1 mounted on a first lead frame LF1 and configured to emit green light of a first green wavelength, a third light-emitting device LED3 mounted on a third lead frame LF3 and configured to emit blue light, a phosphor PSP existing inside an encapsulation layer ENCAP and emitting red light.

Referring to FIG. 3 and FIGS. 6 to 8, in the light-emitting device package LED-PKG according to embodiments of the present disclosure, the second internal light-emitting device package IN-PKG2 may include a second light-emitting device LED 2 mounted on a second lead frame LF2 and configured to emit green light of a second green wavelength which is different from the first green wavelength, a fourth light-emitting device LED4 mounted on a fourth lead frame LF4 and configured to emit blue light, a phosphor PSP existing inside an encapsulation layer ENCAP and emitting red light.

Referring to FIG. 4, in the light-emitting device package LED-PKG according to the embodiments of the present disclosure, the lead frame LF may be divided into four lead frames LF1, LF2, LF3, and LF4. For example, the lead frame LF may be a single structure including four electrically isolated lead frame regions which may be considered as four lead frames LF1, LF2, LF3, and LF4, or it may be composed of four separate lead frames (e.g., lead frames LF1, LF2, LF3, and LF4) that are connected to each other.

According to this, the lead frame LF may include a first lead frame LF1 on which the first light-emitting device LED1 is mounted, a second lead frame LF2 on which the second light-emitting device LED2 is mounted, a third lead frame LF3 on which the third light-emitting device LED3 is mounted, and a fourth lead frame LF4 on which the fourth light-emitting device LED4 is mounted.

In order to selectively control the driving each of the first, second, third, and fourth light-emitting devices LED1, LED2, LED3, and LED4, it may be necessary to electrically separate the first, second, third, and fourth lead frames LF1, LF, LF3, LF3, and LF4 from each other.

For this purpose, for the electric separation of the first, second, third, and fourth lead frames LF1, LF2, LF3, and LF4, an insulator may be located between each two adjacent lead frames among the first, second, third, and fourth lead frames LF1, LF2, LF3, and LF4.

According to the above-described lead frame structure, a driving circuit for driving the light-emitting device package LED-PKG may independently control the driving of each of four light-emitting devices LED1, LED2, LED3, and LED4.

Referring to FIG. 5, the first light-emitting device LED1 and the third light-emitting device LED3 included in the first internal light-emitting device package IN-PKG1 may be connected in series between a first anode (Anode 1) and a first cathode (Cathode 1).

In an example, one electrode of the first light-emitting device LED1 may be connected to the first anode (Anode 1), another electrode of the first light-emitting device LED1 may be connected to one electrode of the third light-emitting device LED3, and another electrode of the third light-emitting device LED3 may be connected to the first cathode (Cathode 1).

In another example, one electrode of the first light-emitting device LED1 may be connected to the first cathode (Cathode 1), another electrode of the first light-emitting device LED1 may be connected to one electrode of the third light-emitting device LED3, and another electrode of the third light-emitting device LED3 may be connected to the first anode (Anode 1).

Referring to FIG. 5, the second light-emitting device LED2 and the fourth light-emitting device LED4 included in the second internal light-emitting device package IN-PKG2 may be connected in series between a second anode (Anode 2) and a second cathode (Cathode 2).

In an example, one electrode of the second light-emitting device LED2 may be connected to the second anode (Anode 2), another electrode of the second light-emitting device LED2 may be connected to one electrode of the fourth light-emitting device LED4, and another electrode of the fourth light-emitting device LED4 may be connected to the second cathode (Cathode 2).

In another example, one electrode of the second light-emitting device LED2 may be connected to the second cathode (Cathode 2), another electrode of the second light-emitting device LED2 may be connected to one electrode of the fourth light-emitting device LED4, and another electrode of the fourth light-emitting device LED4 may be connected to the second anode (Anode 2).

As described above, by configuring the first and third light-emitting devices LED1 and LED3 in the first internal light-emitting device package IN-PKG1 of the light-emitting device package LED-PKG according to the embodiments of the present disclosure in a series circuit, constant current can be supplied to the first and third light-emitting devices LED1 and LED3 during the driving of the first internal light-emitting device package IN-PKG1, so that the uniformity of light emitted from the first internal light-emitting device package IN-PKG1 can be improved.

In addition, by configuring the second and fourth light-emitting devices LED2 and LED4 in the second internal light-emitting device package IN-PKG2 of the light-emitting device package LED-PKG according to the embodiments of the present disclosure in a series circuit, constant current can be supplied to the second and fourth light-emitting devices LED2 and LED4 during the driving of the second internal light-emitting device package IN-PKG2, so that the uniformity of light emitted from the second internal light-emitting device package IN-PKG2 can be improved.

Meanwhile, in the light-emitting device package LED-PKG according to the embodiments of the present disclosure, different color spaces may be set according to a voltage applied to each of the first anode (Anode 1) and the second anode (Anode 2).

Accordingly, it is possible to selectively express two or more color spaces using a single light-emitting device package LED-PKG.

Figure 9:
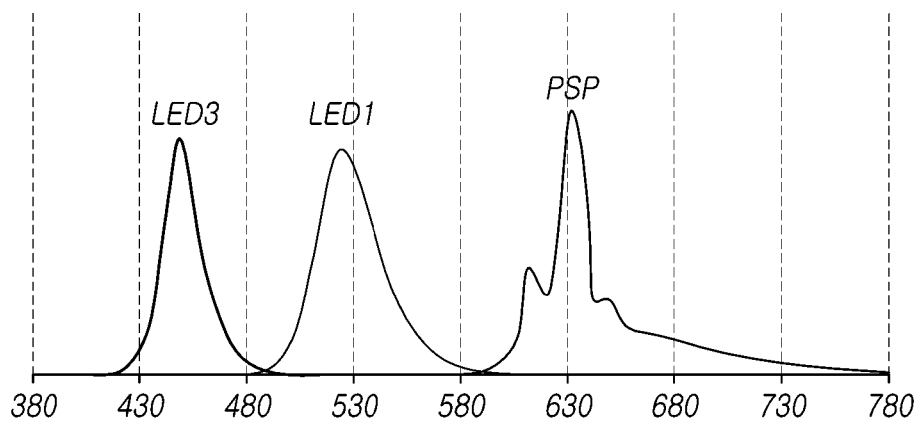
FIG. 9 is a diagram illustrating a light emission spectrum when a first internal light-emitting device package of the light-emitting device package according to embodiments of the present disclosure is driven.
Figure 10:
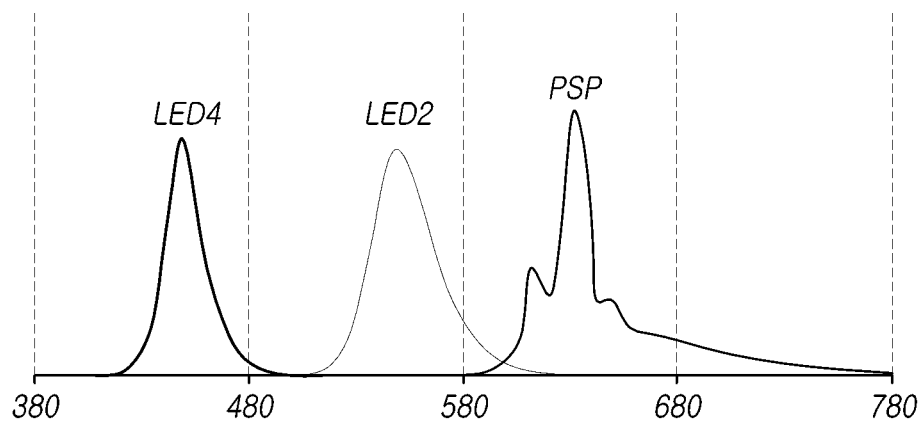
FIG. 10 is a diagram illustrating a light emission spectrum when a second internal light-emitting device package of the light-emitting device package according to embodiments of the present disclosure is driven.
Figure 11:
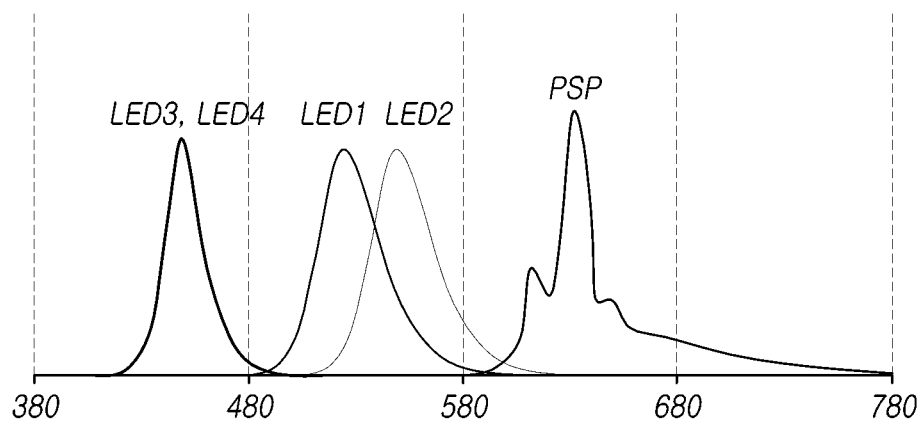
FIG. 11 is a diagram illustrating a light emission spectrum when the first internal light-emitting device package and the second internal light-emitting device package of the light-emitting device package according to embodiments of the present disclosure are driven.
Figure 12:
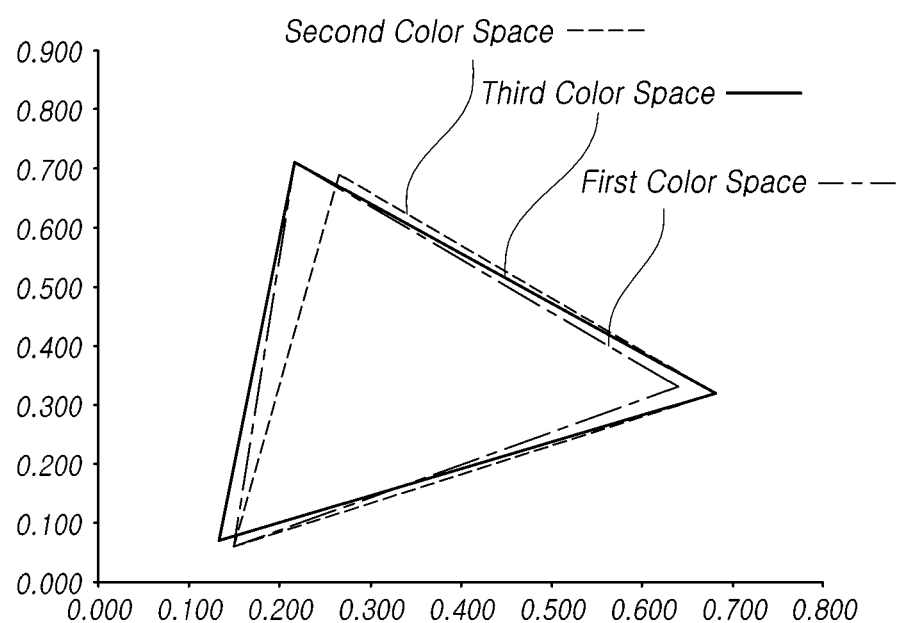
FIG. 12 is a diagram illustrating various color spaces of the light-emitting device package according to embodiments of the present disclosure.

FIGS. 9 to 11 are diagrams illustrating light emission spectrums in the case where one or more of the first internal light-emitting device package IN-PKG1 and the second internal light-emitting device package IN-PKG2 of the light-emitting device package LED-PKG according to the embodiments of the present disclosure are selectively driven. FIG. 12 is a diagram illustrating various color spaces in the case where one or more of the first internal light-emitting device package IN-PKG1 and the second internal light-emitting device package IN-PKG2 of the light-emitting device package LED-PKG according to the embodiments of the present disclosure are selectively driven.

In the light-emitting device package LED-PKG according to the embodiments of the present disclosure, one of two or more color spaces may be selectively set according to a voltage applied to each of the first anode (Anode 1) and the second anode (Anode 2).

Referring to FIGS. 9 and 12, when an ON voltage is applied to the first anode (Anode 1) and an OFF voltage is applied to the second anode (Anode 2), only the first internal light-emitting device package IN-PKG1 is driven (e.g. with the first and third light-emitting devices LED1, LED3 emitting light), so that the first color space can be set in the light-emitting device package LED-PKG.

Accordingly, the light-emitting device package LED-PKG may express a color corresponding to the first color space through the first internal light-emitting device package IN-PKG1.

Referring to FIGS. 10 and 12, when an OFF voltage is applied to the first anode (Anode 1) and an ON voltage is applied to the second anode (Anode 2), only the second internal light-emitting device package IN-PKG2 is driven (e.g. with the second and fourth light-emitting devices LED2, LED4 emitting light), so that the second color space can be set in the light-emitting device package LED-PKG.

Accordingly, the light-emitting device package LED-PKG may express a color corresponding to the second color space through the second internal light-emitting device package IN-PKG2.

Referring to FIGS. 11 and 12, when an ON voltage is applied to the first anode (Anode 1) and an ON voltage is applied to the second anode (Anode 2), the first internal light-emitting device package IN-PKG1 and the second internal light-emitting device package IN-PKG2 are driven (e.g. with the first, second, third, and fourth light-emitting devices LED1, LED2, LED3, LED4 emitting light), so that the third color space can be set in the light-emitting device package LED-PKG.

Accordingly, the light-emitting device package LED-PKG may express a color corresponding to the third color space using both of the first internal light-emitting device package IN-PKG1 and the second internal light-emitting device package IN-PKG2.

A color space described herein may mean a system capable of expressing colors in three-dimensional coordinates. A color gamut, which is similar to a color space in concept, may mean a color region (a color range) created by an arbitrary purpose.

For example, it is a color space that has a coordinate system capable of expressing colors like, RGB, CMYK, XYZ.xyY, Lab, YCbCr, HSL, CIE1931, CIE1964, CIE1976, etc., and sRGB (standard RGB), Adobe RGB, Prophoto RGB, DCI-P3, Rec. 709, BT.2020, ACES, and NTSC correspond to color gamuts.

Typically, a color space and a color gamut are used interchangeably, and herein, a color space may be understood as a color gamut.

A light-emitting device package LED-PKG according to the embodiments of the present disclosure may provide various types of color spaces (color gamuts).

For example, a first color space provided by the light-emitting device package LED-PKG according to the embodiments of the present disclosure may be Adobe RGB, BT.2020, or the like, and may be suitable for a photograph, printed matter, an advertisement, or the like.

For example, a second color space provided by the light-emitting device package LED-PKG according to the embodiments of the present disclosure may be DCI-P3, sRGB, or the like, and may be suitable for a movie, animation, a game content, or the like.

For example, the third color space provided by the light-emitting device package LED-PKG according to the embodiments of the present disclosure may be NTSC, DCI-P3, or the like, and may be suitable for a content requiring high brightness such as an HDR or a game content.

Figure 13:
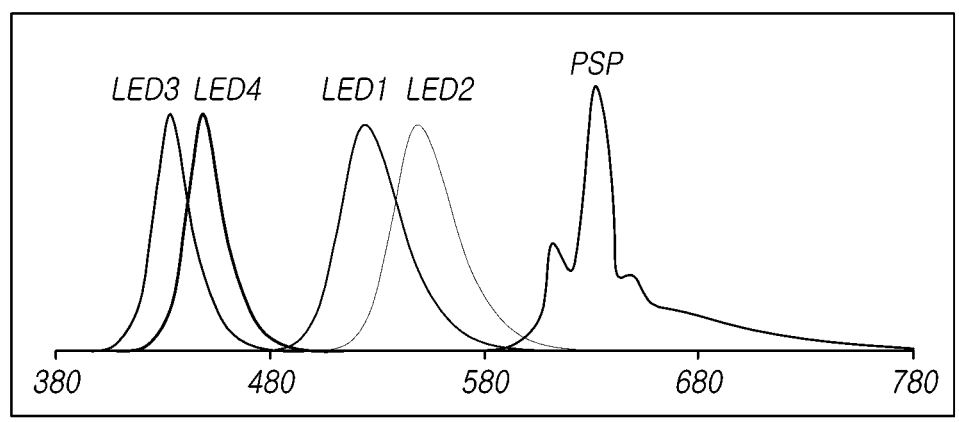
FIG. 13 is a diagram illustrating another light emission spectrum of the light-emitting device package according to embodiments of the present disclosure.

FIG. 13 is a diagram illustrating another light emission spectrum of the light-emitting device package LED-PKG according to embodiments of the present disclosure.

Referring to FIG. 13, in the light-emitting device package LED-PKG according to the embodiments of the present disclosure, the third light-emitting device LED3 and the fourth light-emitting device LED4 may emit third color lights (e.g., blue lights) having different wavelengths.

For example, the wavelength of the third color light emitted from the third light-emitting device LED3 may be shorter than the wavelength of the third color light emitted from the fourth light-emitting device LED4. More particularly, the third light-emitting device LED3 may emit blue light within a first wavelength band of the blue light wavelengths, and the fourth light-emitting device LED4 may emit blue light within a second wavelength band of the blue light wavelengths. While the first and second wavelength bands of blue light emitted by the third and fourth light-emitting devices LED3, LED4, respectively, may partially overlap, the first wavelength band of blue light emitted by the third light-emitting diode LED3 generally corresponds to shorter wavelengths of blue light than the second wavelength band of blue light emitted by the fourth light-emitting diode LED4. That is, the first wavelength band of light emitted by the third light-emitting diode LED3 is shifted to the left relative to the second wavelength band of light emitted by the fourth light-emitting diode LED4 in the diagram of FIG. 13.

Figure 14:
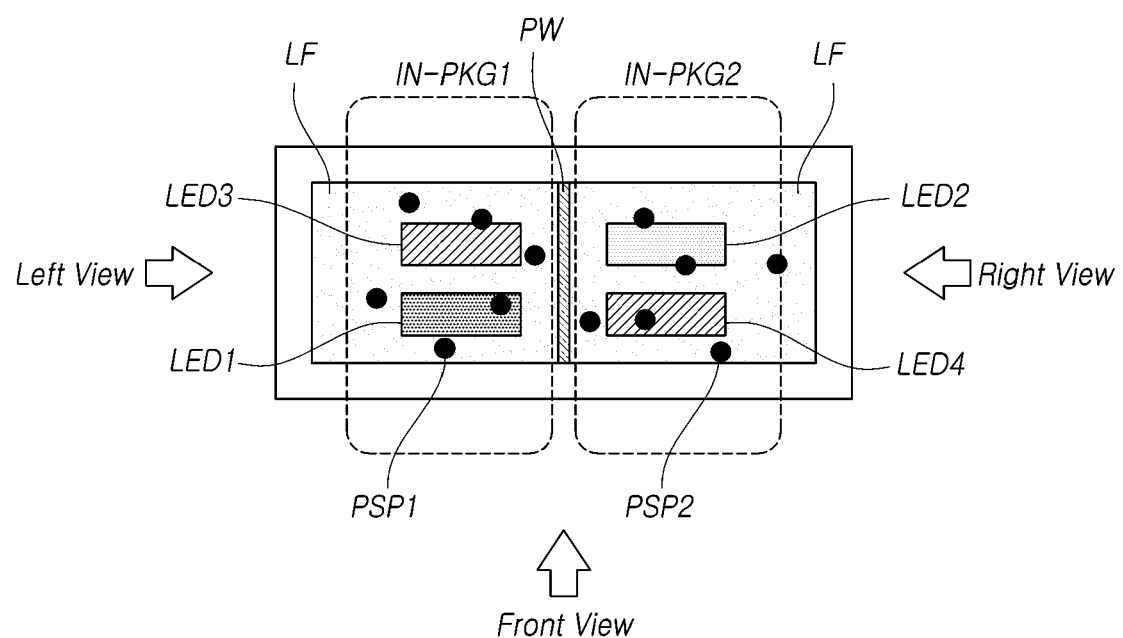
FIG. 14 is a diagram illustrating a top view of a light-emitting device package having a partition structure according to embodiments of the present disclosure.
Figure 15:
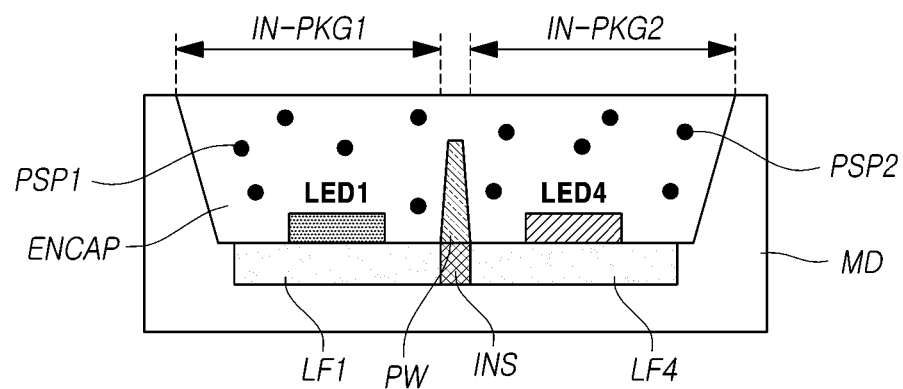
FIGS. 15, 16, and 17 are diagrams illustrating a front view, a left side view, and a right side view, respectively, of the light-emitting device package having the partition structure shown in FIG. 14 according to embodiments of the present disclosure.
Figure 16:
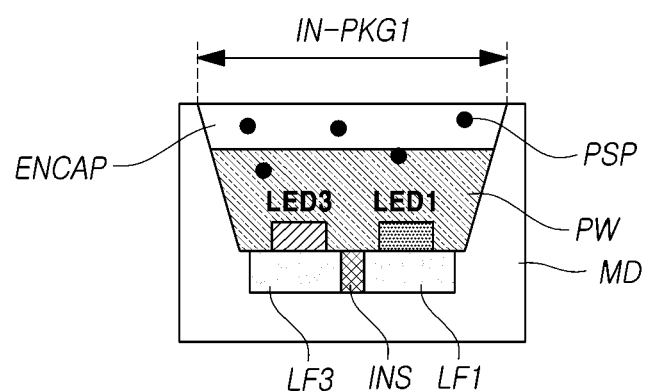
Figure 17:
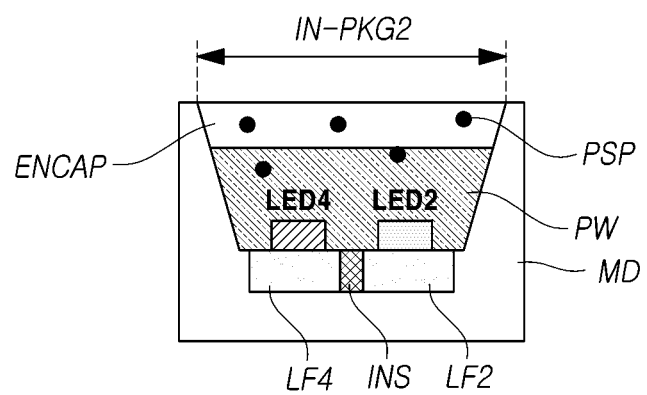
Figure 18:
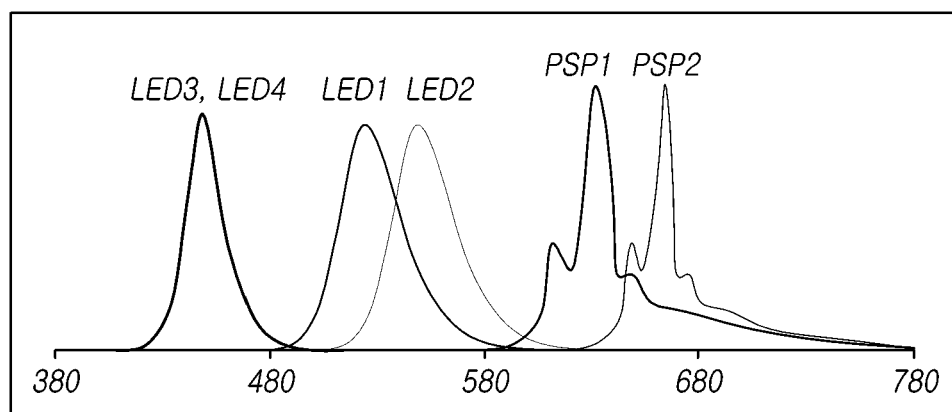
FIG. 18 is a diagram illustrating a light emission spectrum of the light-emitting device package having the partition structure according to embodiments of the present disclosure.

FIG. 14 is a diagram illustrating a light-emitting device package LED-PKG having a partition wall PW structure according to embodiments of the present disclosure. FIGS. 15, 16, and 17 are diagrams illustrating a front view, a left side view, and a right side view, respectively, of the light-emitting device package LED-PKG having a partition wall PW structure shown in FIG. 14 according to the embodiments of the present disclosure. FIG. 18 is a diagram illustrating a light emission spectrum of a light-emitting device package LED-PKG having a partition wall PW structure according to embodiments of the present disclosure.

Referring to FIGS. 14 to 17, the light-emitting device package LED-PKG according to embodiments of the present disclosure may have a structure in which a partition wall PW is located between a first internal light-emitting device package IN-PKG1 including a first light-emitting device LED1 and a third light-emitting device LED3 and a second internal light-emitting device package IN-PKG2 including a second light-emitting device LED2 and a fourth light-emitting device LED4.

Accordingly, in the light-emitting device package LED-PKG according to the embodiments of the present disclosure, the light-emitting characteristics of the first internal light-emitting device package IN-PKG1 and the second internal light-emitting device package IN-PKG2 can be effectively separated and selectively used due to the partition wall structure.

As illustrated in FIGS. 14 to 17, the height of the partition wall PW may be lower than the height of the encapsulant ENCAP.

The material forming the partition wall PW may be the same material as the insulator INS, or may be made of a material which is the same as a mold MD, which may be any molding compound or the like which forms a supporting body or structure for the package.

Meanwhile, referring to FIGS. 14 to 17, the phosphor PSP contained in the encapsulant ENCAP of the light-emitting device package LED-PKG according to the embodiments of the present disclosure may include a first phosphor PSP1 existing in the region of the first internal light-emitting device package IN-PKG1 and a second phosphor PSP2 existing in the region of the second internal light-emitting device package IN-PKG2. The first and second phosphors PSP1, PSP2 may be embedded and dispersed throughout respective regions of the encapsulant ENCAP, for example, as particles having any suitable size and shape for desired light emission characteristics.

The first phosphor PSP1 and the second phosphor PSP2 may emit first color lights (e.g., red light) having the same wavelength characteristic.

Alternatively, as illustrated in FIG. 18, the first phosphor PSP1 and the second phosphor PSP2 may emit first color lights (e.g., red light) having different wavelengths.

According to this, by using the different light emission characteristics of respective first and the second phosphors PSP1 and PSP2 in the light-emitting device package LED-PKG according to the embodiments of the present disclosure, it is possible to further dramatically improve the characteristics of a white light source. Accordingly, it is possible to express more various color spaces using a single light-emitting device package.

Figure 19:
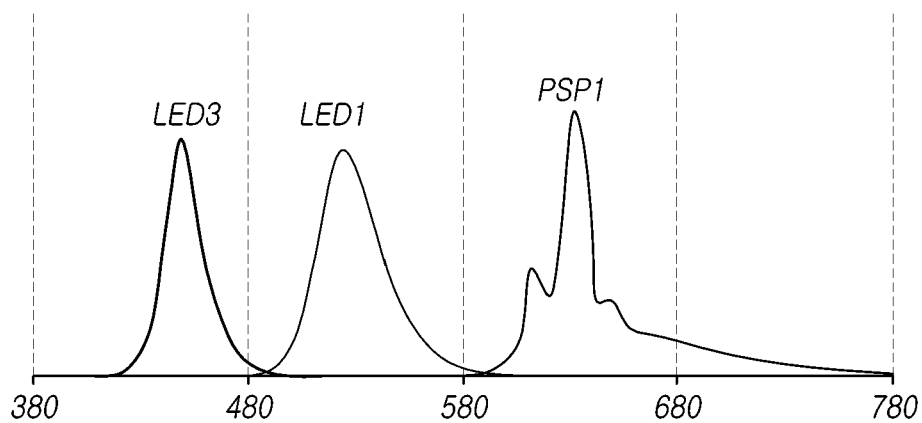
FIG. 19 is a diagram illustrating a light emission spectrum when a first internal light-emitting device package of the light-emitting device package having the partition structure according to embodiments of the present disclosure is driven.
Figure 20:
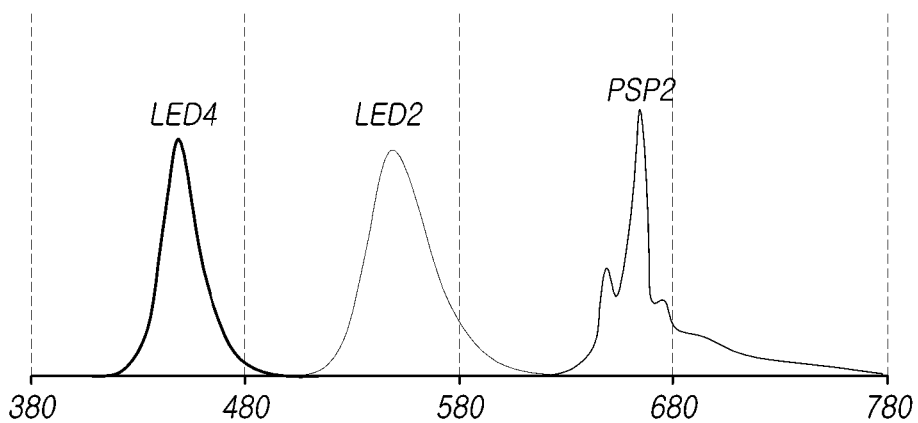
FIG. 20 is a diagram illustrating a light emission spectrum when a second internal light-emitting device package of the light-emitting device package having the partition structure according to embodiments of the present disclosure is driven.
Figure 21:
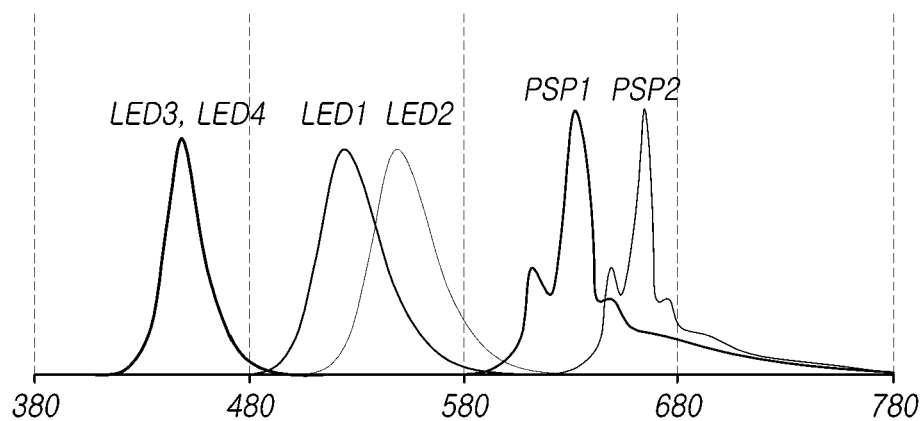
FIG. 21 is a diagram illustrating a light emission spectrum when the first internal light-emitting device package and the second internal light-emitting device package of the light-emitting device package having the partition structure according to embodiments of the present disclosure are driven.

FIGS. 19 to 21 are diagrams illustrating light emission spectrums in the case where one or more of the first internal light-emitting device package IN-PKG1 and the second internal light-emitting device package IN-PKG2 of the light-emitting device package LED-PKG having a partition wall PW structure according to the embodiments of the present disclosure are selectively driven.

Referring to FIG. 19, when an ON voltage is applied to the first anode and an OFF voltage is applied to the second anode, so that only the first internal light-emitting device package IN-PKG1 is driven, the light-emitting device package LED-PKG having the partition wall PW structure may be configured such that the overall light emission spectrum can be determined by the third light-emitting device LED3, the first light-emitting device LED1, and the first phosphor PSP1 that is provided in the region of the first internal light-emitting device package IN-PKG1.

Referring to FIG. 20, when an OFF voltage is applied to the first anode and an ON voltage is applied to the second anode, so that only the second internal light-emitting device package IN-PKG2 is driven, the light-emitting device package LED-PKG having the partition wall PW structure may be configured such that the overall light emission spectrum can be determined by the fourth light-emitting device LED4, the second light-emitting device LED2, and the second phosphor PSP2 that is provided in the region of the second internal light-emitting device package IN-PKG2.

The light emission spectrum in FIG. 19 differs from the light emission spectrum in FIG. 20. Accordingly, different color spaces (or color gamuts) can be expressed by the separate driving of the first internal light-emitting device package IN-PKG1 and the second internal light-emitting device package IN-PKG2.

In the case of FIG. 21, when an ON voltage is applied to both the first anode and the second anode, so that both the first internal light-emitting device package IN-PKG1 and the second internal light-emitting device package IN-PKG2 are driven, the light-emitting device package LED-PKG having the partition wall PW structure according to the embodiments of the present disclosure may have a light emission spectrum in which the light emission spectrum of FIG. 19 and the light emission spectrum of FIG. 20 are mixed.

As described above, the wavelength of the second color light emitted from the second light-emitting device LED2 is longer than the wavelength of the second color light emitted from the first light-emitting device LED1.

Meanwhile, referring to FIGS. 18 to 21, the wavelength of the first color light emitted by the second phosphor PSP2 may be longer than the wavelength of the first color light emitted by the first phosphor PSP1. The wavelength bandwidth of the first color light emitted from the second phosphor PSP2 may be narrower than the wavelength bandwidth of the first color light emitted from the first phosphor PSP1.

In other words, the first phosphor PSP1 of the first internal light-emitting device package IN-PKG1 may emit the first color light having a relatively short wavelength and wide wavelength band, and the second phosphor PSP2 of the second internal light-emitting device package IN-PKG2 may emit the first color light having a relatively long wavelength and narrow wavelength band.

In this case, the first color light emitted from the second phosphor PSP2 may have a color tone deeper than that of the first color light emitted from the first phosphor PSP1.

Therefore, the expressed first color (e.g., red) exhibits a lighter color tone according to the driving of the first internal light-emitting device package IN-PKG1, and the first color (e.g., red) exhibits a deeper color tone according to the second internal light-emitting device package IN-PKG2. Accordingly, by selectively driving the first internal light-emitting device package IN-PKG1 and the second internal light-emitting device package IN-PKG2, the light-emitting device package LED-PKG according to the embodiments of the present disclosure may satisfy the requirement or a desired range for the color tone of the first color.

Figure 22:
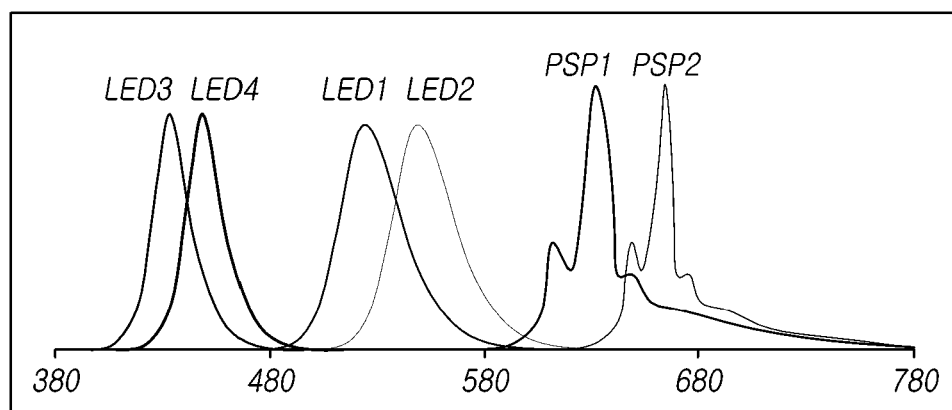
FIG. 22 is a diagram illustrating another light emission spectrum of the light-emitting device package having the partition structure according to embodiments of the present disclosure.

FIG. 22 is a diagram illustrating another light emission spectrum of a light-emitting device package LED-PKG having a partition wall PW structure according to embodiments of the present disclosure.

Referring to FIG. 22, in the light-emitting device package LED-PKG having a partition wall PW structure according to the embodiments of the present disclosure, the third light-emitting device LED3 and the fourth light-emitting device LED4 may emit third color lights having different wavelengths.

For example, the wavelength of the third color light emitted from the third light-emitting device LED3 may be shorter than the wavelength of the third color light emitted from the fourth light-emitting device LED4.

When the different light emission characteristics of the third light-emitting device LED3 and the fourth light-emitting device LED4 in the light-emitting device package LED-PKG according to the embodiments of the present disclosure are used, it is possible to further dramatically improve the characteristics of a white light source. Accordingly, it is possible to express more various color spaces using a single light-emitting device package.

Meanwhile, the four light-emitting devices LED1, LED2, LED3, and LED4 in the light-emitting device package LED-PKG according to the embodiments of the present disclosure may be arranged in two rows and two columns as illustrated in FIGS. 1 and 3, and may be arranged in various other ways. An example thereof is illustrated in FIG. 23.

Figure 23:
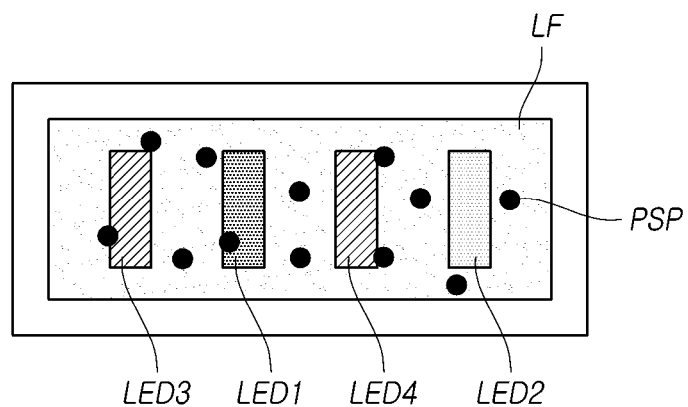
FIG. 23 is a diagram illustrating another arrangement structure of light-emitting devices in the light-emitting device package according to embodiments of the present disclosure.

FIG. 23 is a diagram illustrating another arrangement structure of the four light-emitting devices LED1, LED2, LED3, and LED4 in the light-emitting device package LED-PKG according to the embodiments of the present disclosure.

Referring to FIG. 23, the four light-emitting devices LED1, LED2, LED3, and LED4 in the light-emitting device package LED-PKG according to the embodiments of the present disclosure may be arranged in a row.

As an example of the arrangement order of the four light-emitting devices LED1, LED2, LED3, and LED4, the first light-emitting device LED1 and the third light-emitting device LED3 included in the first internal light-emitting device package IN-PKG1 may be disposed adjacent to each other. In addition, the second light-emitting device LED2 and the fourth light-emitting device LED4 included in the second internal light-emitting device package IN-PKG2 may be disposed adjacent to each other.

In the example of FIG. 23, the first, second, third, and fourth lead frames LF1, LF2, LF3, and LF4 included in the lead frame LF may be separated from each other by an insulator INS with reference to the four light-emitting devices LED1, LED2, LED3, and LED4.

Figure 24:
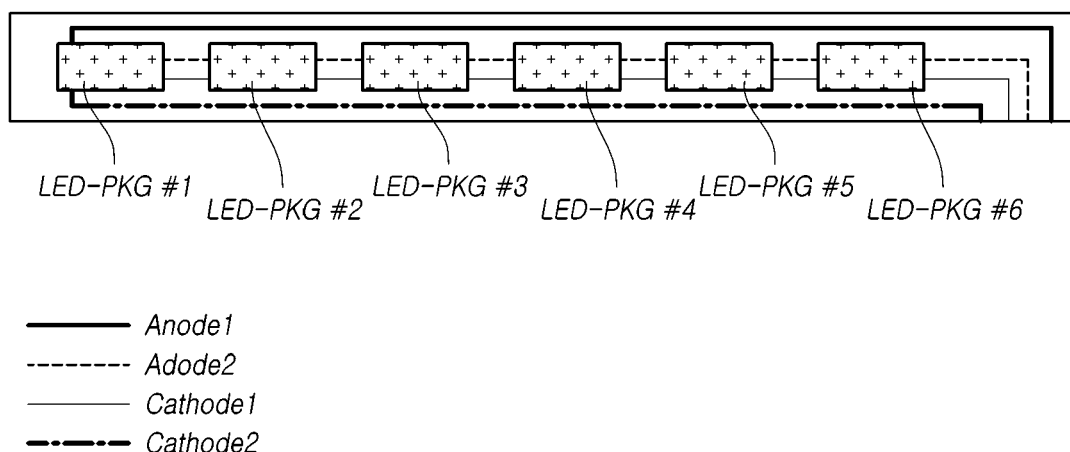
FIG. 24 is a diagram illustrating a light-emitting device array according to embodiments of the present disclosure.

FIG. 24 is a diagram illustrating a light-emitting device array according to embodiments of the present disclosure.

Referring to FIG. 24, a light-emitting device array may be configured using a plurality of light-emitting device packages LED-PKG #1 to LED-PKG #6.

In the plurality of light-emitting device packages LED-PKG #1 to LED-PKG #6, a first anode (Anode 1), a first cathode (Cathode 1), a second anode (Anode 2), and a second cathode (Cathode 2) may be connected in series.

In this case, the first internal light-emitting device packages IN-PKG1, each included in one of the plurality of light-emitting device packages LED-PKG #1 to LED-PKG #6, may be simultaneously driven, e.g., by a current between the first anode (Anode 1) and the first cathode (Cathode 1) which passes through the first internal light-emitting device packages IN-PKG1 of each of the plurality of light-emitting device packages LED-PKG #1 to LED-PKG #6. In this case, the second internal light-emitting device packages IN-PKG2, each included in one of the plurality of light-emitting device packages LED-PKG #1 to LED-PKG #6, may be simultaneously driven, e.g., by a current between the second anode (Anode 2) and the second cathode (Cathode 2) which passes through the second internal light-emitting device packages IN-PKG2 of each of the plurality of light-emitting device packages LED-PKG #1 to LED-PKG #6.

According to the serial connection method of the plurality of light-emitting device packages LED-PKG #1 to LED-PKG #6, the uniformity of the total light supplied by the light-emitting device array can be improved.

The light-emitting device array in FIG. 24 may selectively switch the driving of the first internal light-emitting device package IN-PKG1 and the second internal light-emitting device package IN-PKG1 included in each of the plurality of light-emitting device package LED-PKG #1 to LED-PKG #6.

Assuming, for example, that the first color light is a red light, the second color light is a green light, and the third color light is a blue light, it can be said that the light-emitting device array in FIG. 24 has a switchable Green Blue-red (GB-r) LED array structure.

The light-emitting device package LED-PKG according to the embodiments of the present disclosure described above may be utilized as a light source of various electronic devices such as a display device and a lighting device.

An electronic device according to the embodiments of the present disclosure may include a light-emitting device package LED-PKG configured to output white light and a driving unit configured to drive the light-emitting device package LED-PKG.

Hereinafter, a display device 2500 and a lighting device 3100 will be briefly described as an example of an electronic device utilizing the light-emitting device package LED-PKG according to the embodiments of the present disclosure.

Figure 25:
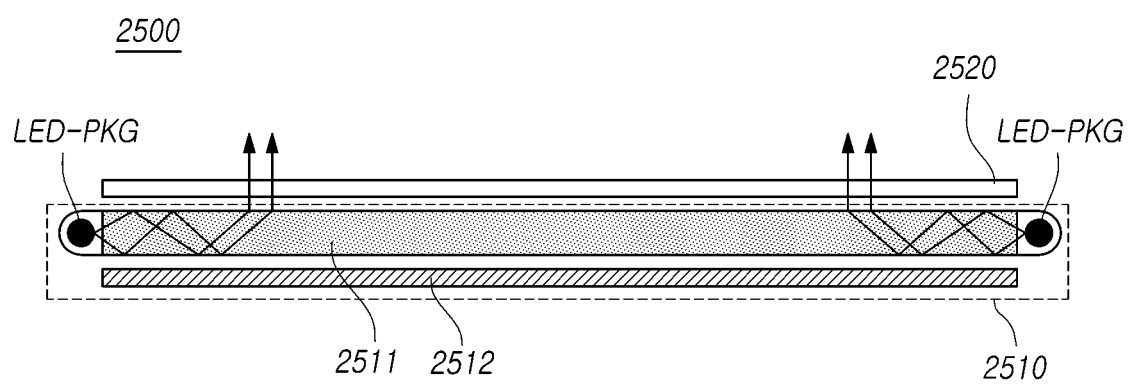
FIG. 25 is a diagram illustrating a display device having an edge-type backlight unit utilizing a light-emitting device package according to embodiments of the present disclosure.
Figure 26:
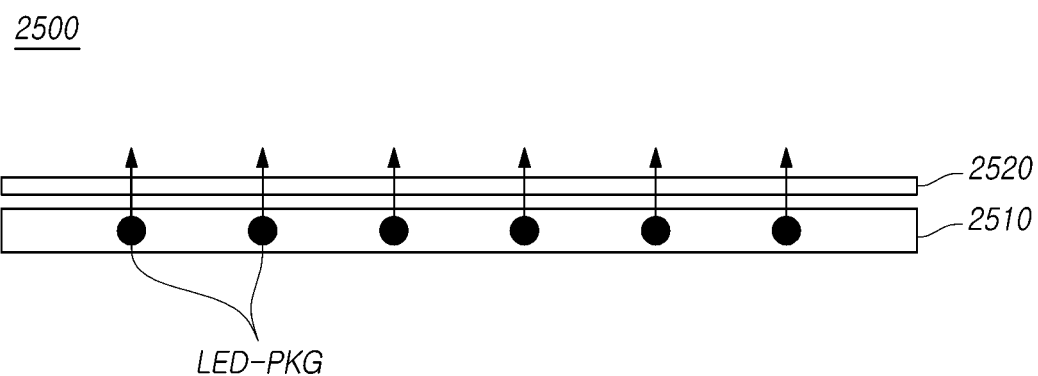
FIG. 26 is a diagram illustrating a display device having a direct-type backlight unit utilizing a light-emitting device package according to embodiments of the present disclosure.
Figure 27:
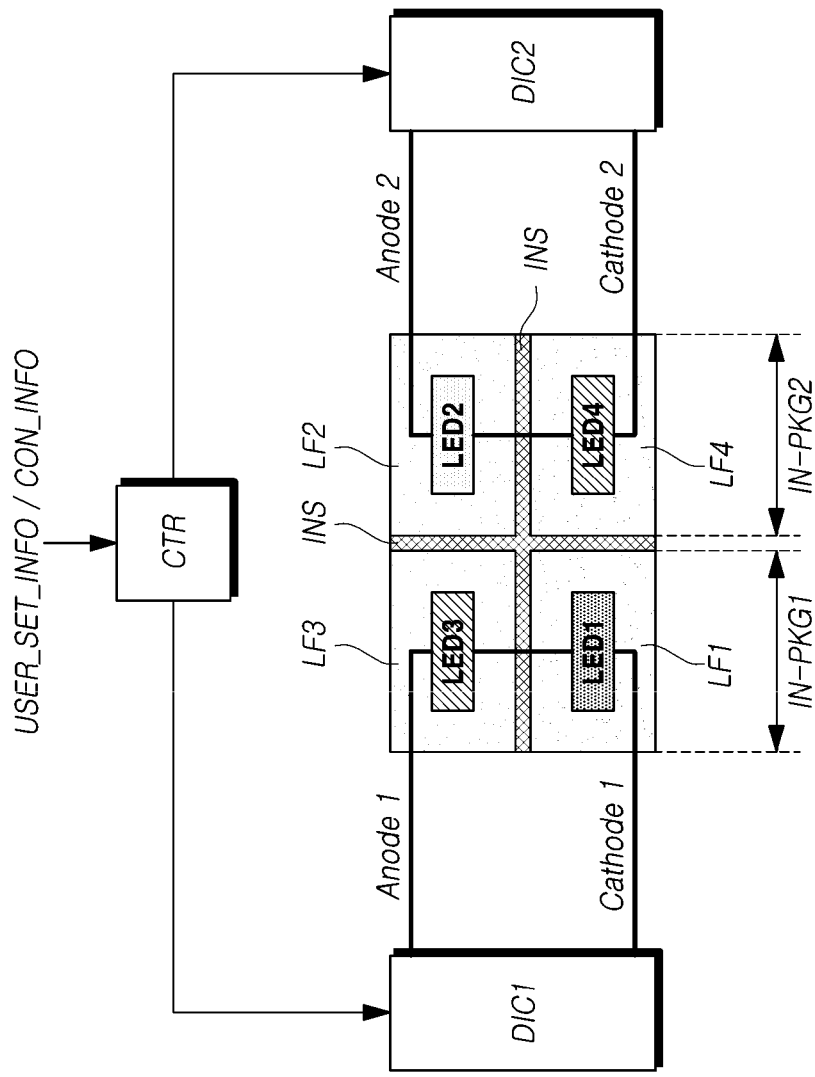
FIG. 27 is a diagram illustrating driving circuit configurations of a light-emitting device package in the display device according to embodiments of the present disclosure.
Figure 28:
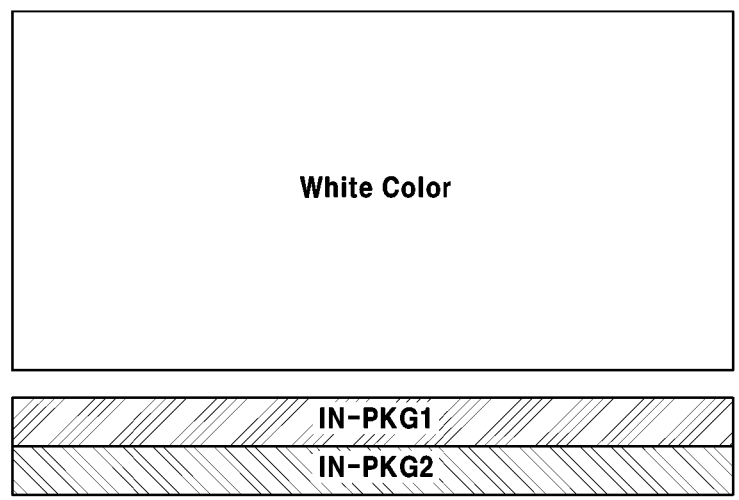
FIGS. 28 to 30 are diagrams illustrating three types of modes of the display device according to embodiments of the present disclosure.
Figure 28:
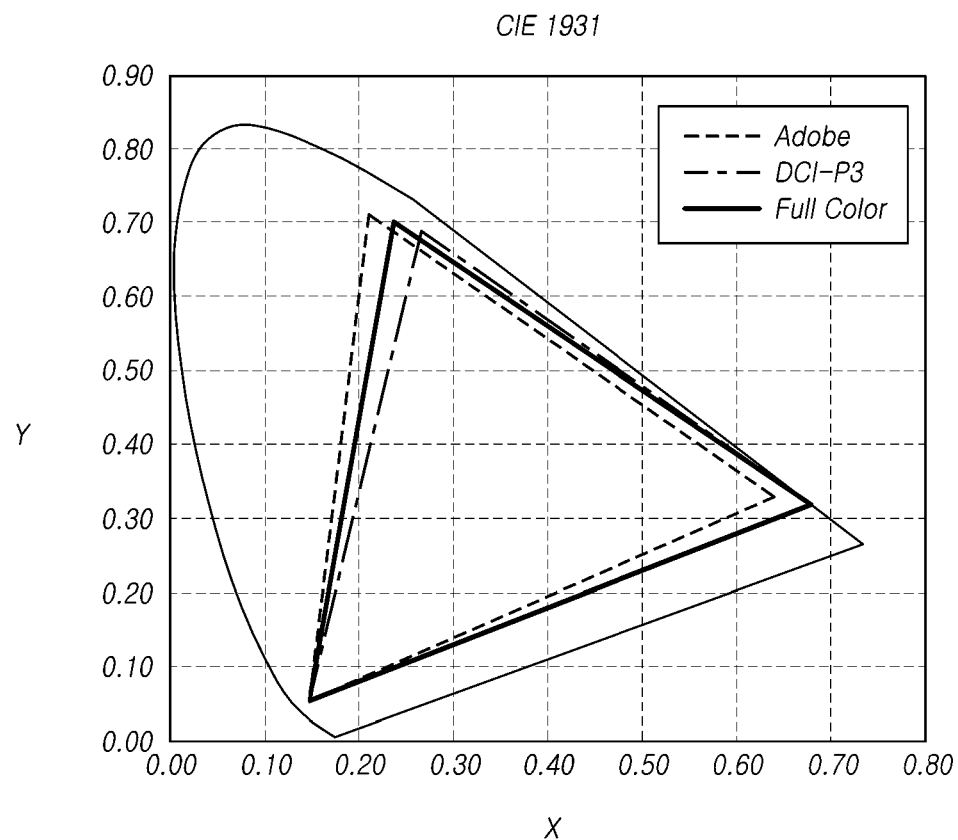
Figure 29:
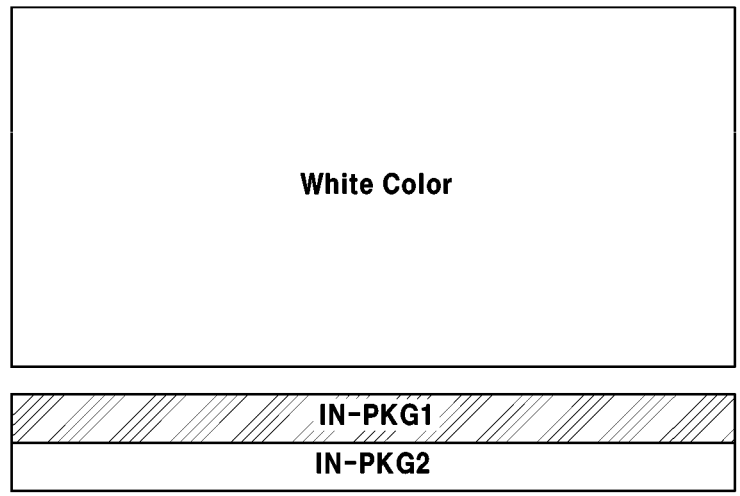
Figure 29:
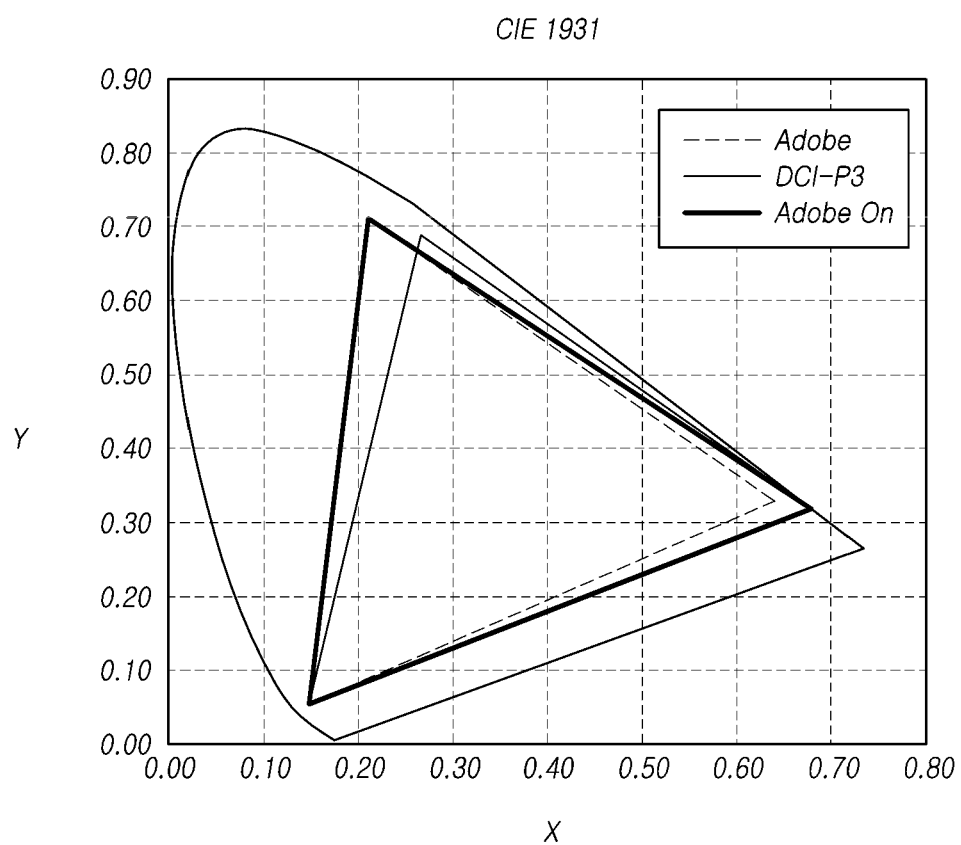
Figure 30:
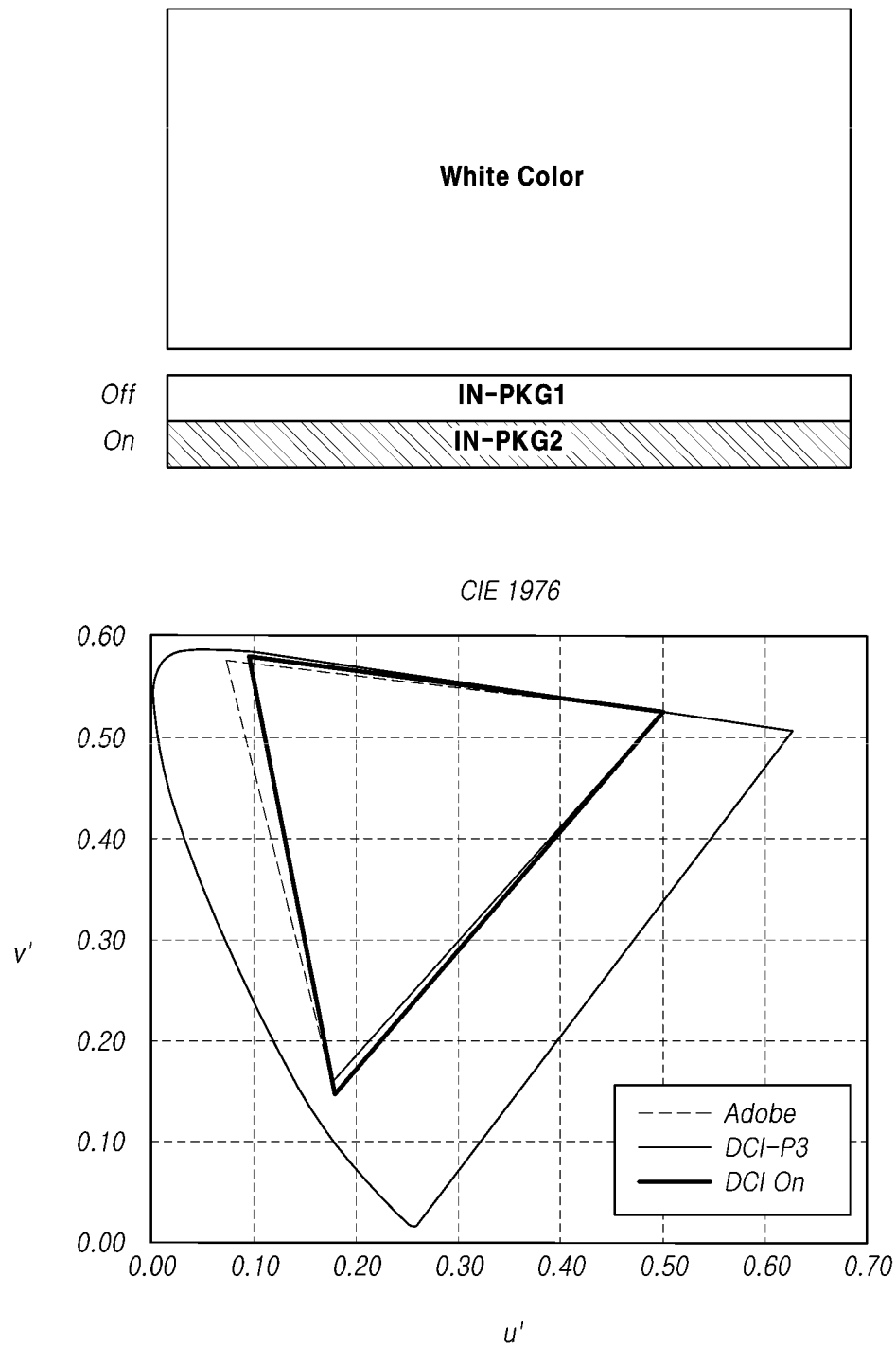

FIGS. 25 and 26 are diagrams illustrating a display device 2500 according to embodiments of the present disclosure, and FIG. 27 is a diagram illustrating driving circuit components of the light-emitting device package LED-PKG in the display device 2500 according to embodiments of the present disclosure. FIGS. 28 to 30 are diagrams illustrating three types of modes of the display device 2500 according to embodiments of the present disclosure.

Referring to FIGS. 25 and 26, the display device 2500 according to the embodiments of the present disclosure may include a display panel 2520, a backlight unit 2510 disposed below the display panel 2520 to supply white light to the display panel 2520, and the like.

Referring to FIGS. 25 and 26, a light-emitting device package LED-PKG according to embodiments of the present disclosure may be a light source included in the backlight unit 2510.

Referring to FIG. 27, the display device 2500 according to embodiments of the present disclosure may further include, for example, a driving unit configured to drive a light-emitting device package LED-PKG included in a backlight unit 2510 as a light source and configured to output white light.

As illustrated in FIG. 25, the backlight unit 2510 may be of an edge type in which the light source is located on a side (an edge portion) of the display panel 2520.

Here, the light source disposed on the side of the display panel 2520 may be the light-emitting device package LED-PKG according to the embodiments of the present disclosure. As shown in FIG. 25, one or more light-emitting device packages LED-PKG may be disposed on each of opposing sides of a light guide plate 2511.

The edge-type backlight unit 2510 may include the light guide plate 2511 disposed below the display panel 2520.

In addition, the edge-type backlight unit 2510 may include a reflective plate 2512 disposed under the light guide plate 2511. The reflective plate 2512 may be formed of a light reflective material and may reflect incident light toward the light guide plate 2511 and the display panel 2520.

As illustrated in FIG. 26, the backlight unit 2510 may be of a direct type in which the light source is located below the display panel 2520.

Here, the light source disposed just below the display panel 2520 may be one or more of the light-emitting device packages LED-PKG according to the embodiments of the present disclosure.

Referring to FIG. 27, the light-emitting device package LED-PKG configured to output white light as a light source in the backlight unit 2520 in the display device 2500 according to the embodiments of the present disclosure is the same as that described above.

Briefly, a light-emitting device package LED-PKG serving as a light source in the backlight unit in the display device 2500 according to embodiments of the present disclosure may include a lead frame LF, a first light-emitting device LED1 mounted on the lead frame LF, a second light-emitting device LED2 mounted on the frame LF, a third light-emitting device LED3 mounted on the lead frame LF, a fourth light-emitting device LED4 mounted on the lead frame LF, and phosphor PSP contained in an encapsulant (ENCAP in FIG. 6) existing on the first, second, third, and fourth light-emitting devices LED1, LED2, LED3, and LED4.

The phosphor PSP may emit a first color light.

The first light-emitting device LED1 and the second light-emitting device LED2 may emit second color lights.

The third light-emitting device LED3 and the fourth light-emitting device LED4 may emit third color lights.

The phosphor PSP may emit the first color light by absorbing energy from the second color lights emitted from the first light-emitting device LED1 and the second light-emitting device LED2 and the third color lights emitted from the third light-emitting device LED3 and the fourth light-emitting device LED4.

The first color light, the second color light, and the third color light may be the color lights having different colors. For example, the first color light, the second color light, and the third color light may be lights corresponding to the three primary colors, respectively.

Meanwhile, in the light-emitting device package LED-PKG according to the embodiments of the present disclosure, the first light-emitting device LED1 and the second light-emitting device LED2 may emit the second color lights having different wavelengths within the wavelength band of the second color.

By using the display device 2500 according to the above-described embodiments of the present disclosure, it is possible to dramatically improve the characteristics of the white light source, so that various color spaces can be expressed using only one type of light-emitting device package LED-PKG, the power of expression in colors can be increased, and image quality can be greatly improved.

Referring to FIG. 27, the driving unit included in the display device 2500 according to the embodiments of the present disclosure may include a first driving circuit DIC1 configured to drive the first light-emitting device LED1 in the light-emitting device package LED-PKG, a second driving circuit DIC2 configured to drive the second light-emitting device LED2 in the light-emitting device package LED-PKG, and a controller CTR configured to control whether to drive each of the first light-emitting device LED1 and the second light-emitting device LED2.

The first driving circuit DIC1 may drive not only the first light-emitting device LED1, but also the third light-emitting device LED3 included in the first internal light-emitting device package IN-PKG1. The second driving circuit DIC2 may drive not only the second light-emitting device LED2, but also the fourth light-emitting device LED4 included in the second internal light-emitting device package IN-PKG2.

The first driving circuit DIC1 and the second driving circuit DIC2 described above may be separately configured or may be implemented in an integrated form. For example, both the first driving circuit DIC1 and the second driving circuit DIC2 may be implemented in a same integrated circuit (IC), with the integrated circuit (IC) having separate outputs to each of the first and second internal light-emitting device packages IN-PKG1, IN-PKG2.

According to the foregoing description, the display device 2500 according to the embodiments of the present disclosure is capable of expressing colors of desired types of color spaces (color gamuts) variously by selectively switching the driving of the first internal light-emitting device package IN-PKG1 and the second internal light-emitting device package IN-PKG2 included in each light-emitting device package LED-PKG under any event situation or under any condition.

Referring to FIG. 27, the controller CTR may control whether to drive each of the first light-emitting device LED1 and the second light-emitting device LED2 in each light-emitting device package LED-PKG according to user-setting information USER_SET_INFO or content information CON INFO.

Accordingly, the display device 2500 according to the embodiments of the present disclosure may be configured such that the color spaces (color gamuts) may be manually changed according to the user-setting information USER_SET_INFO, or may be automatically changed according to the content information CON INFO. The user-setting information USER_SET_INFO may be, for example, information received from a user input (e.g., by control of a selectable element, such as a button, dial, knob, touch input, remote controller input, or the like) indicative of a desired color setting. The content information CON INFO may be, for example, color information associated with received content, such as received image data, to be displayed on the display device 2500.

Depending on an amount of current supplied from each of the first, second, third, and fourth lead frames LF1, LF2, LF3, and LF4 to each of the first, second, third, and fourth light-emitting devices LED1, LED2, LED3, and LED4 by the operation of the first and second driving circuits DIC1 and DIC2 according to the control of the controller CTR, the first, second, third, and fourth light-emitting devices LED1, LED2, LED3, and LED4 may have light emission properties (e.g., wavelengths and/or intensity of light) which are independent from each other.

For example, the wavelengths or intensity of light emitted from at least one of the first, second, third, and fourth light-emitting devices LED1, LED2, LED3, and LED3 may be controlled differently by differently controlling the amount of current supplied to at least one of the first, second, third, and fourth light-emitting devices LED1, LED2, LED3, and LED4.

Referring to FIGS. 28 to 30, the display device 2500 according to the embodiments of the present disclosure may operate in three modes (mode 1, mode 2, and mode 3), for example. In some embodiments, the controller CTR may selectively enter the display device 2500 into one of the three modes (mode 1, mode 2, and mode 3), which may be based at least in part on one or both of the user-setting information USER_SET_INFO and the content information CON INFO.

Referring to FIG. 28, in the case of operating in mode 1, the display device 2500 according to the embodiments of the present disclosure may provide a third color space (which corresponds to the full color in FIG. 28 and may be in an intermediate form of the first color space and the second color space) by driving, for example, both of the first internal light-emitting device package IN-PKG1 and the second internal light-emitting device package IN-PKG2 included in each light-emitting device package LED-PKG.

Here, for example, the first color space (which may also be referred to as a "first color gamut") may be Adobe (which may also be referred to as "Adobe RGB"), and the second color space (which may also be referred to as a "second color gamut") may be DCI-P3.

Referring to FIG. 29, in the case of operating in mode 2, the display device 2500 according to the embodiments of the present disclosure may provide the first color space by driving, for example, the first internal light-emitting device package IN-PKG1 included in each light-emitting device package LED-PKG, but not driving the second internal light-emitting device package IN-PKG2 included in each light-emitting device package LED-PKG.

Here, for example, the first color space (which may be referred to as a "first color gamut") may be Adobe (also referred to as "Adobe RGB").

Referring to FIG. 30, in the case of operating in mode 3, the display device 2500 according to the embodiments of the present disclosure may provide the second color space by driving, for example, the second internal light-emitting device package IN-PKG2 included in each light-emitting device package LED-PKG, but not driving the first internal light-emitting device package IN-PKG1 included in each light-emitting device package LED-PKG.

Here, for example, the second color space (which may be referred to as a "second color gamut") may be DCI-P3.

Figure 31:
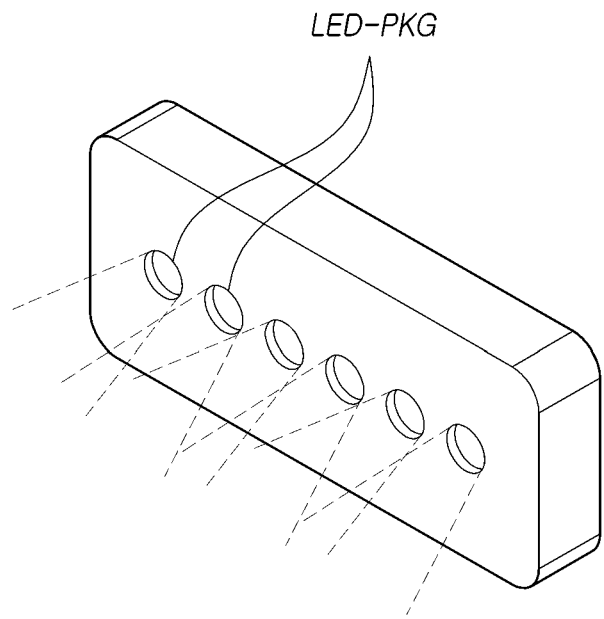
FIG. 31 is a diagram illustrating a lighting device according to embodiments of the present disclosure.

FIG. 31 is a diagram illustrating a lighting device 3100 according to embodiments of the present disclosure.

A lighting device 3100 according to the embodiments of the present disclosure may include at least one light-emitting device package LED-PKG configured to output white light and a driving unit (which may be the same as that of FIG. 27) configured to drive the at least one light-emitting device package LED-PKG.

According to the embodiments of the present disclosure disclosed above, it is possible to provide a light-emitting device package and an electronic device capable of expressing various color spaces.

According to the embodiments of the present disclosure, it is possible to provide a light-emitting device package and an electronic device capable of selecting one of various expressible color spaces and expressing the selected color space.

According to the embodiments of the present disclosure, it is possible to provide a light-emitting device package and an electronic device capable of adaptively controlling an expressible color space in accordance with a user's demand or a display situation.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the technical idea of the present disclosure, and the scope of the present disclosure is not limited by the embodiments provided herein. The scope of the present disclosure shall be construed on the basis of the accompanying claims in such a manner that all of the technical ideas included within the scope equivalent to the claims belong to the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting device package comprising:
a first internal light-emitting device package including:
a first light-emitting device mounted on a lead frame;
a third light-emitting device mounted on the lead frame;
a phosphor contained in an encapsulant present on the first and third light-emitting devices, and
a second internal light-emitting device package including:
a second light-emitting device mounted on the lead frame;
a fourth light-emitting device mounted on the lead frame;
the phosphor contained in the encapsulant present on the second and fourth light-emitting devices; and
a partition wall,
wherein the phosphor emits a first color of light,
the first light-emitting device and the second light-emitting device emit a second color of light,
the third light-emitting device and the fourth light-emitting device emit a third color of light,
the second color of light emitted from the first light-emitting device and the second color of light emitted from the second light-emitting device have different wavelengths,
the first light-emitting device of the first internal light-emitting device package is diagonally positioned with respect to the second light-emitting device of second internal light-emitting device package,
the third light-emitting device of the first internal light-emitting device package is diagonally positioned with respect to the fourth light-emitting device of second internal light-emitting device package, and
the first light-emitting device and the third light-emitting device are connected in series between a first anode and a first cathode, and the second light-emitting device and the fourth light-emitting device are connected in series between a second anode and a second cathode, the first and second anodes being electrically isolated from one another, and the first and second cathodes being electrically isolated from one another.

2. The light-emitting device package of claim 1, wherein the first light-emitting device and the second light-emitting device emit the first color light which is any one of red light, green light and blue light, and
wherein the phosphor emits the second color light different from the first color light among the red light, the green light and the blue light.

3. The light-emitting device package of claim 1, wherein a first wavelength of the first color light emitted from the first light-emitting device and a second wavelength of the first color light emitted from the second light emitting device are included in a wavelength band range of the first color light, and
wherein the first wavelength of the first color light emitted from the first light-emitting device is longer or shorter wavelength than the second wavelength of the first color light emitted from the second light-emitting device.

4. The light-emitting device package of claim 3, wherein when the second wavelength of the first color light emitted from the second light-emitting device is longer wavelength than the first wavelength of the first color light emitted from the first light-emitting device,
wherein a wavelength of the light emitted from the phosphor of the second internal light emitting device package including the second light-emitting device has a longer wavelength than a wavelength of the light emitted from the phosphor of the first internal light emitting device package including the first light-emitting device.

5. The light-emitting device package of claim 1, wherein a first color space provided by the driving of the first internal light-emitting device package includes Adobe RGB or BT.2020.

6. The light-emitting device package of claim 1, wherein when a photo, print, or advertisement is displayed on the display panel, a first color space is provided by driving the first internal light-emitting device package.

7. The light-emitting device package of claim 1, wherein a second color space provided by the driving of the second internal light-emitting device package includes DCI or standard RGB.

8. The light-emitting device package of claim 1, wherein when a movie, an animation, or a game content is displayed on the display panel, the second color space is provided by driving the second internal light-emitting device package.

9. The light-emitting device package of claim 1, wherein the third color space provided by driving both the first internal light-emitting device package and the second internal light-emitting device package includes NTSC and DCI-P3.

10. The light-emitting device package of claim 1, wherein when high-brightness content is displayed on the display panel, the third color space is provided by driving both the first internal light-emitting device package and the second internal light-emitting device package.

11. The light-emitting device package of claim 1, wherein the lead frame further includes a first lead frame, a second lead frame, a third lead frame, and a fourth lead frame,
wherein the first lead frame, the second lead frame, the third lead frame, and the fourth lead frame are spaced apart from each other,
wherein the first lead frame and the second lead frame are opposite to and diagonally facing each other, and
wherein the third lead frame and the fourth lead frame are opposite to and diagonally facing each other.

12. The light-emitting device package of claim 11, wherein the first light-emitting device is on the first lead frame,
wherein the second light-emitting device is on the second lead frame,
wherein the third light-emitting device is on the third lead frame,
wherein the fourth light-emitting device is on the fourth lead frame, and
wherein each first, second, third, and fourth lead frames are spaced apart from each other via an insulator.

13. The light-emitting device package of claim 12, wherein the partition wall structure is on the insulator between the second lead frame and the fourth lead frame.

14. The light-emitting device package of claim 13, wherein the partition wall structure is on the insulator between the first lead frame and the third lead frame.

15. The light-emitting device package of claim 14, wherein the partition wall structure is on the insulator between the second lead frame and the third lead frame.

16. The light-emitting device package of claim 1, wherein the partition wall structure includes a trapezoidal cross-section.

17. The light-emitting device package of claim 1,
wherein the first and third light-emitting devices are electrically connected between the first anode and the first cathode, and the second and fourth light-emitting devices are electrically connected between the second anode and the second cathode.

18. The light-emitting device package of claim 11, wherein a top surface of the insulator is in flush with surfaces of at least one of the first, second, third, and fourth lead frames.

* * * * *